(12) United States Patent
Kim

(10) Patent No.: US 10,879,935 B2
(45) Date of Patent: Dec. 29, 2020

(54) LDPC DECODER, SEMICONDUCTOR MEMORY SYSTEM, AND OPERATING METHOD THEREOF

(71) Applicant: SK hynix Inc., Gyeonggi-do (KR)

(72) Inventor: Dae-Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 28 days.

(21) Appl. No.: 16/424,954

(22) Filed: May 29, 2019

(65) Prior Publication Data
US 2020/0136653 A1  Apr. 30, 2020

(30) Foreign Application Priority Data
Oct. 24, 2018 (KR) .......................... 10-2018-0127721

(51) Int. Cl.
*H03M 13/25* (2006.01)
*G11C 16/08* (2006.01)
*G06F 11/10* (2006.01)
*H03M 13/11* (2006.01)
*H03M 13/53* (2006.01)

(52) U.S. Cl.
CPC .......... *H03M 13/255* (2013.01); *G06F 11/10* (2013.01); *G11C 16/08* (2013.01); *H03M 13/1125* (2013.01)

(58) Field of Classification Search
None
See application file for complete search history.

(56) References Cited

U.S. PATENT DOCUMENTS

| | | | | |
|---|---|---|---|---|
| 7,590,914 B2* | 9/2009 | Kim | ................. | H03M 13/6362 714/752 |
| 8,694,868 B1* | 4/2014 | Chilappagari | ..... | H03M 13/1108 714/774 |
| 9,250,994 B1 | 2/2016 | Vakilinia et al. | | |
| 9,503,125 B2 | 11/2016 | Zhang | | |
| 2011/0029756 A1* | 2/2011 | Biscondi | ........... | H03M 13/3715 712/22 |
| 2013/0024745 A1* | 1/2013 | Sharon | ................ | H03M 13/114 714/763 |

OTHER PUBLICATIONS

Ngangom et al., Efficient memory optimization and high throughput decoding architecture based on LDPC codes, IEEE, Conference Paper, pp. 1-4 (Year: 2013).*

* cited by examiner

*Primary Examiner* — April Y Blair
*Assistant Examiner* — Dipakkumar B Gandhi
(74) *Attorney, Agent, or Firm* — IP & T Group LLP

(57) ABSTRACT

A semiconductor memory system includes: a semiconductor memory device for storing a code word; a decoder for decoding stored the code word based on a parity check matrix formed of sub-matrices to generate decoded data; and a channel for coupling the semiconductor memory device to the decoder and providing the decoder with the stored code word, wherein the decoder includes: a variable node selecting device for sequentially selecting sub-matrices sharing the same layer of the parity check matrix and sequentially selecting variable nodes respectively corresponding to columns forming the selected sub-matrices; a variable node updating device for updating the selected variable nodes based on a channel message and check node messages provided to the selected variable nodes; and a check node updating device for updating the check nodes based on variable node messages provided to the check nodes coupled to the selected variable nodes.

20 Claims, 18 Drawing Sheets

FIG. 6B

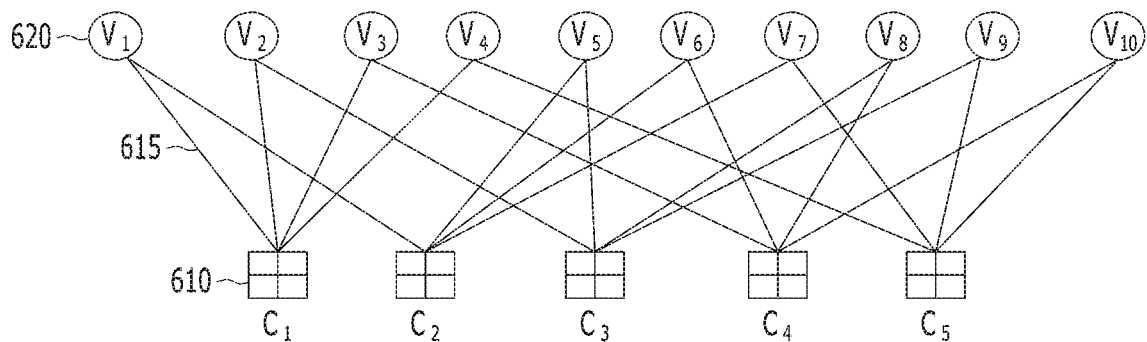

FIG. 6C

- After 1 iteration $\underline{v} = (0 \quad 1 \quad 1 \quad 0 \quad 1 \quad 0 \quad 0 \quad 0 \quad 1 \quad 1)$ $$H\underline{v}^t = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \begin{pmatrix} 0 \\ 1 \\ 1 \\ 0 \\ 1 \\ 0 \\ 0 \\ 0 \\ 1 \\ 1 \end{pmatrix} = \begin{pmatrix} 0 \\ 1 \\ 0 \\ 0 \\ 0 \end{pmatrix} \neq \underline{0} \longrightarrow \text{Perform next iteration}$$

Syndrome check

LDPC DECODER, SEMICONDUCTOR MEMORY SYSTEM, AND OPERATING METHOD THEREOF

CROSS-REFERENCE TO RELATED APPLICATION

The present application claims priority of Korean Patent Application No. 10-2018-0127721, filed on Oct. 24, 2018, which is incorporated herein by reference in its entirety.

BACKGROUND

1. Field

Various embodiments of the present invention relate to a low density parity check (LDPC) decoder, a semiconductor memory system, and a method for operating the semiconductor memory system.

2. Description of the Related Art

In general, semiconductor memory devices are classified into volatile memory devices, such as dynamic random access memory (DRAM) and static RAM (SRAM), and non-volatile memory devices, such as read only memory (ROM), mask ROM (MROM), programmable ROM (PROM), erasable PROM (EPROM), electrically EPROM (EEPROM), ferromagnetic RAM (FRAM), phase change RAM (PRAM), magnetic RAM (MRAM), resistive RAM (RRAM or ReRAM) and flash memory.

A volatile memory device loses data stored therein when power supply thereto is interrupted, whereas a non-volatile memory device retains data stored therein even when power supply thereto is interrupted. A non-volatile flash memory device is widely used as a storage medium in a computer system because of its high program speed, low power consumption and large data storage capacity.

In non-volatile memory devices, especially of the flash type, states of data of each memory cell depend on the number of bits that the memory cell can program. A memory cell storing 1-bit data per cell is called a single-bit cell or a single-level cell (SLC). A memory cell storing multi-bit data (i.e., 2 or more bits of data) per cell is called a multi-bit cell, a multi-level cell (MLC) or a multi-state cell. The MLC is advantageous for high integration. However, as the number of bits programmed in each memory cell increase, the reliability decreases and the read failure rate increases.

For example, when k bits are to be programmed in a memory cell, one of $2^k$ threshold voltages is formed in the memory cell. Due to the minute differences between the electrical characteristics of memory cells, the threshold voltages of memory cells programmed for the same data form threshold voltage distributions. The threshold voltage distributions correspond to $2^k$ data values representing k-bit information, respectively.

However, a voltage window available for the threshold voltage distributions is finite. Therefore, as the value k increases, the distance between the threshold voltage distributions decreases and the neighboring threshold voltage distributions overlap each other. As the neighboring threshold voltage distributions overlap each other, read data may include more errors, i.e., several error bits to several tens of error bits.

FIG. 1 is a threshold voltage distribution illustrating program and erase states of a 3-bit multi-level cell (3-bit MLC) non-volatile memory device.

FIG. 2 is a threshold voltage distribution illustrating program and erase states due to characteristic deterioration of the 3-bit MLC non-volatile memory device.

In the MLC non-volatile memory device, e.g., the MLC flash memory device capable of storing k-bit data in a single memory cell, the memory cell may have one of $2^k$ threshold voltage distributions. For example, the 3-bit MLC has one of 8 threshold voltage distributions.

The threshold voltages of memory cells programmed for the same data form the threshold voltage distribution due to characteristic differences between memory cells. In the 3-bit MLC non-volatile memory device, as illustrated in FIG. 1, the threshold voltage distributions are formed in correspondence with the data states including 7 program states 'P1' to 'P7' and an erase state 'E'.

FIG. 1 shows an ideal case in which the threshold voltage distributions do not overlap and have read voltage margins therebetween. Referring to the flash memory example of FIG. 2, the memory cell may experience charge loss as electrons trapped at a floating gate or tunnel oxide film are discharged over time. Such charge loss may accelerate when the tunnel oxide film deteriorates by iterative program and erase operations. The charge loss results in a decrease in the threshold voltages of memory cells. For example, as illustrated in FIG. 2, the threshold voltage distribution may be shifted left due to charge loss.

Further, program disturbance, erase disturbance and/or back pattern dependency also cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, the memory cell actually having the third program state 'P3' may be erroneously determined to have the second program state 'P2'. In short, when the neighbouring threshold voltage distributions overlap as illustrated in FIG. 2, read data may include a significant number of errors.

Therefore, a scheme for precisely reading data stored in memory cells of a semiconductor memory device is needed.

SUMMARY

Embodiments of the present invention are directed to a memory controller capable of quickly and accurately decoding data stored in a memory cell, a semiconductor memory system including such memory controller, and a method of operating the semiconductor memory system.

In accordance with an embodiment of the present invention, a semiconductor memory system includes: a semiconductor memory device suitable for storing a code word, which is encoded data; a decoder suitable for decoding stored the code word based on a parity check matrix formed of sub-matrices to generate decoded data; and a channel suitable for coupling the semiconductor memory device to the decoder and providing the decoder with stored the code word, wherein the decoder includes: a variable node selecting device suitable for performing a variable node selection operation of sequentially selecting sub-matrices sharing the same layer of the parity check matrix and sequentially selecting variable nodes respectively corresponding to columns forming the selected sub-matrices; a variable node updating device suitable for performing a variable node update operation of updating the selected variable nodes based on a channel message and check node messages provided to the selected variable nodes; and a check node updating device suitable for performing a check node update operation of updating the check nodes based on variable node messages provided to the check nodes coupled to the selected variable nodes.

In accordance with another embodiment of the present invention, a method for operating a semiconductor memory system includes: sequentially selecting sub-matrices sharing the same layer of a parity check matrix and sequentially selecting variable nodes respectively corresponding to columns forming the selected sub-matrices; updating the selected variable nodes based on a channel message and check node messages provided to the selected variable nodes; and updating the check nodes based on variable node messages provided to the check nodes coupled to the selected variable nodes, wherein the sequentially selecting of the sub-matrices sharing the same layer of the parity check matrix and the sequentially selecting of the variable nodes respectively corresponding to the columns forming the selected sub-matrices, the updating of the selected variable nodes based on the channel message and the check node messages provided to the selected variable nodes, and the updating of the check nodes based on the variable node messages provided to the check nodes coupled to the selected variable nodes are determined as one iteration unit, and the iteration unit is repeatedly performed until a code word is successfully decoded up to a maximum number of times.

In accordance with an embodiment of the present invention, a decoding device includes: a variable node selecting device suitable for sequentially selecting variable nodes respectively corresponding to columns forming sub-matrices, which share the same layer of a parity check matrix including a plurality of sub-matrices; a variable node updating device suitable for updating the selected variable nodes based on a channel message and check node messages provided to the selected variable nodes; and a check node updating device suitable for updating the check nodes based on variable node messages provided to the check nodes coupled to the selected variable nodes, wherein the sequentially selecting of the variable nodes, the updating of the selected variable nodes, and the updating of the check nodes are performed as an iteration unit until a code word is successfully decoded up to a maximum number of times.

Preferably, the method for operating a semiconductor memory system further includes: generating the channel message including a channel symbol and a channel log likelihood ratio (LLR) vector based on a code word provided from a channel; terminating decoding and outputting the decoded data when a zero vector is obtained by multiplying symbols of variable nodes corresponding to all columns that form the parity check matrix by the parity check matrix; and generating a variable node message including an edge symbol and an edge LLR vector.

Preferably, the updating of the selected variable nodes based on the channel message and the check node messages provided to the selected variable nodes includes: initializing a symbol of each of the selected variable nodes as a channel symbol.

Preferably, the updating of the check nodes based on the variable node messages provided to the check nodes coupled to the selected variable nodes includes: performing an initial check node update operation of updating check nodes coupled to the initialized variable nodes, when the updating of the selected variable nodes based on the channel message and the check node messages provided to the selected variable nodes is initially performed onto variable nodes corresponding to all the columns that form the parity check matrix.

Preferably, the updating of the selected variable nodes based on the channel message and the check node messages provided to the selected variable nodes includes: calculating sums of log likelihood ratios (LLRs) included in check node LLR vectors of the check node messages provided to the selected variable nodes and LLRs included in a channel LLR vector of the channel message for each non-binary element, and updating a non-binary element corresponding to a minimum value with the symbol of each of the selected variable nodes.

Preferably, the generating of the variable node message including the edge symbol and the edge LLR vector includes: generating extrinsic information based on the channel message and the check node messages; detecting a variable node symbol based on the extrinsic information; generating a variable node LLR vector based on the detected variable node symbol and the generated extrinsic information; and generating the edge symbol and the edge LLR vector by multiplying the detected variable node symbol and the generated variable node LLR vector by an edge gain.

Preferably, the generating of the extrinsic information based on the channel message and the check node messages includes: generating extrinsic information by calculating sums of LLRs included in the channel LLR vector and LLRs included in check node LLR vectors of the remaining check node messages, excluding check node messages provided from check nodes which are to provide the variable node message from each of the selected variable nodes, among the check node messages provided to the selected variable nodes for each non-binary element.

Preferably, the detecting of the variable node symbol based on the extrinsic information includes: re-setting a non-binary element corresponding to a minimum value of the sums of the LLRs calculated for each non-binary element based on the extrinsic information with variable node symbols of the variable node messages provided from the selected variable nodes to the check nodes coupled to the selected variable nodes.

Preferably, the generating of the variable node LLR vector based on the detected variable node symbol and the generated extrinsic information includes: generating the variable node LLR vector by performing an extrinsic information normalization operation to obtain a difference between each of the sums of the LLRs calculated for each of the non-binary elements included in the extrinsic information and a sum of the LLRs for the non-binary element corresponding to the minimum value of the sums of the calculated LLRs.

Preferably, the generating of the edge symbol and the edge LLR vector by multiplying the detected variable node symbol and the generated variable node LLR vector by the edge gain includes: obtaining first non-binary elements corresponding to LLRs positioned in the respective rows of the variable node LLR vector and second non-binary elements by multiplying the first non-binary elements by the edge gain, and generating the edge LLR vector by determining the LLRs respectively corresponding to the first non-binary elements as LLRs of the second non-binary elements having the same value as the first non-binary elements, respectively.

Preferably, the updating of the check nodes based on the variable node messages provided to the check nodes coupled to the selected variable nodes includes: generating a check node message including a check node symbol and a check node LLR vector based on a variable node message, a first minimum value vector, and a second minimum value vector; and generating a compensation edge gain symbol and a compensation edge gain LLR vector by multiplying the generated check node message by an inverse number of an edge gain.

Preferably, the updating of the check nodes based on the variable node messages provided to the check nodes coupled to the selected variable nodes includes: setting variable node symbols of the variable node messages provided to the check nodes coupled to the selected variable nodes as previous variable node symbols after the check node message is generated, and updating the first minimum value vector and the second minimum value vector by comparing sizes of components positioned in the same row of the first minimum value vector, the second minimum value vector, and the variable node LLR vector with each other.

Preferably, the generating of the check node message including the check node symbol and the check node LLR vector based on the variable node message, the first minimum value vector, and the second minimum value vector includes: generating a check node symbol by performing an XOR operation onto an XOR symbol which is obtained by performing an XOR operation onto the previous variable node symbol and variable node symbols provided from all variable nodes provided to the check nodes coupled to the selected variable nodes; and generating the check node LLR vector based on one between the first minimum value vector and the second minimum value vector.

BRIEF DESCRIPTION OF THE DRAWINGS

FIG. 6B is a schematic diagram illustrating an LDPC code.

FIG. 6C is a schematic diagram illustrating a syndrome check process according to LDPC decoding.

DETAILED DESCRIPTION

Figure 1:
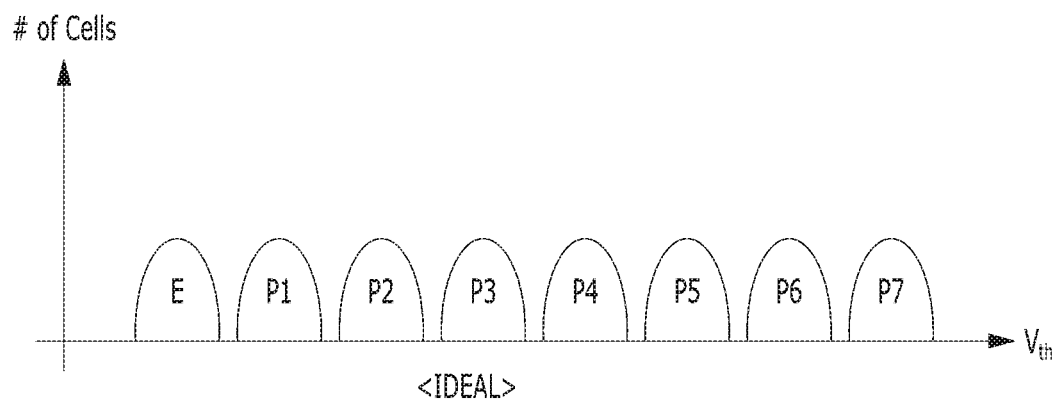
FIG. 1 is a threshold voltage distribution illustrating program and erase states of a 3-bit multi-level cell (3-bit MLC) non-volatile memory device.
Figure 2:
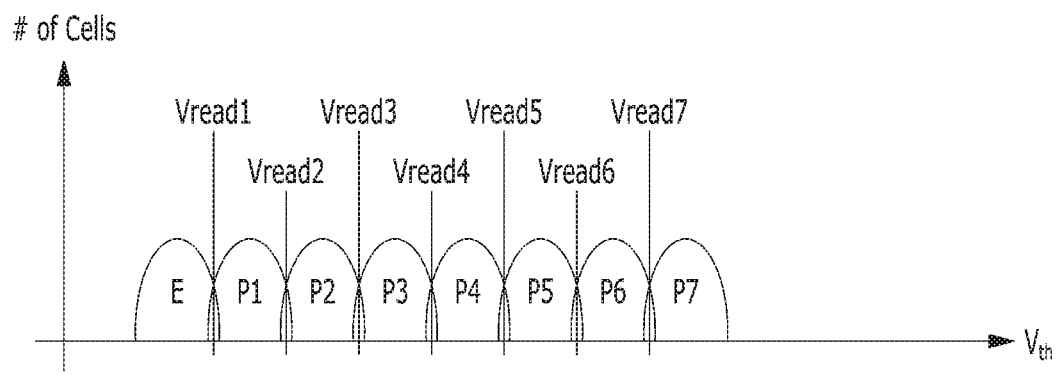
FIG. 2 is a threshold voltage distribution illustrating program and erase states due to characteristic deterioration of a 3-bit MLC non-volatile memory device.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Figure 3:
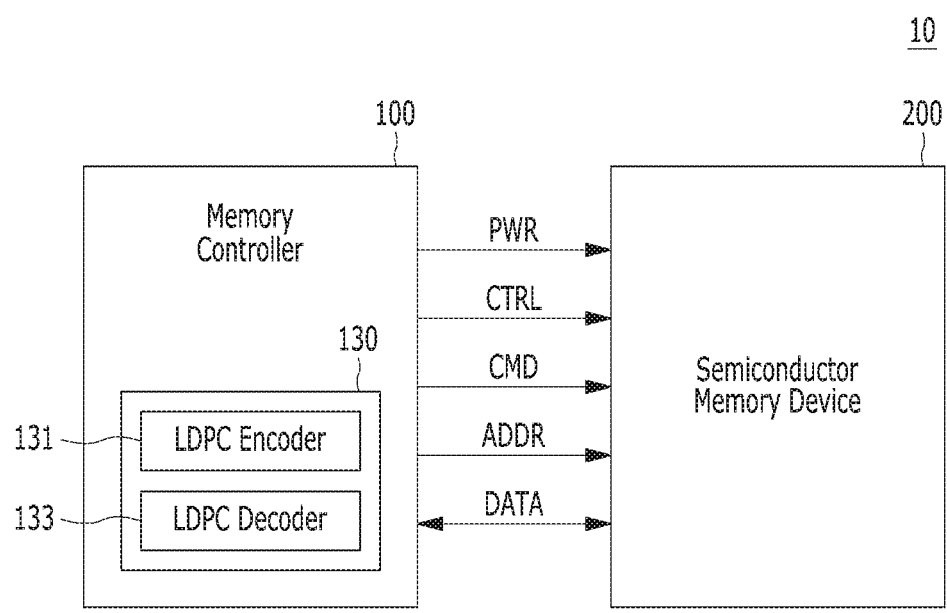
FIG. 3 is a block diagram illustrating a semiconductor memory system in accordance with an embodiment of the present invention.

FIG. 3 is a block diagram illustrating a semiconductor memory system 10 in accordance with an embodiment of the present invention.

Figure 4A:
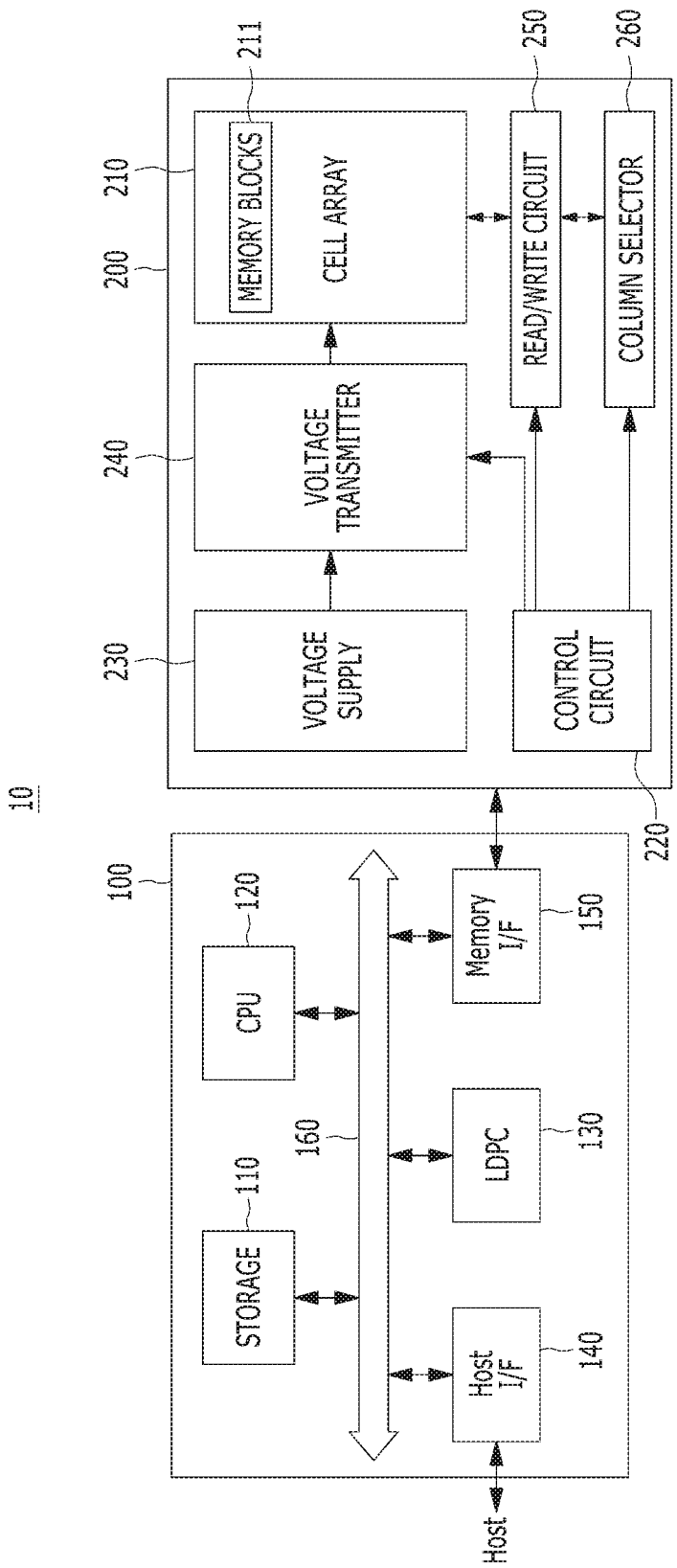
FIG. 4A is a block diagram illustrating a semiconductor memory system, such as that shown in FIG. 3.

FIG. 4A is a block diagram illustrating the semiconductor memory system 10 shown in FIG. 3.

Figure 4B:
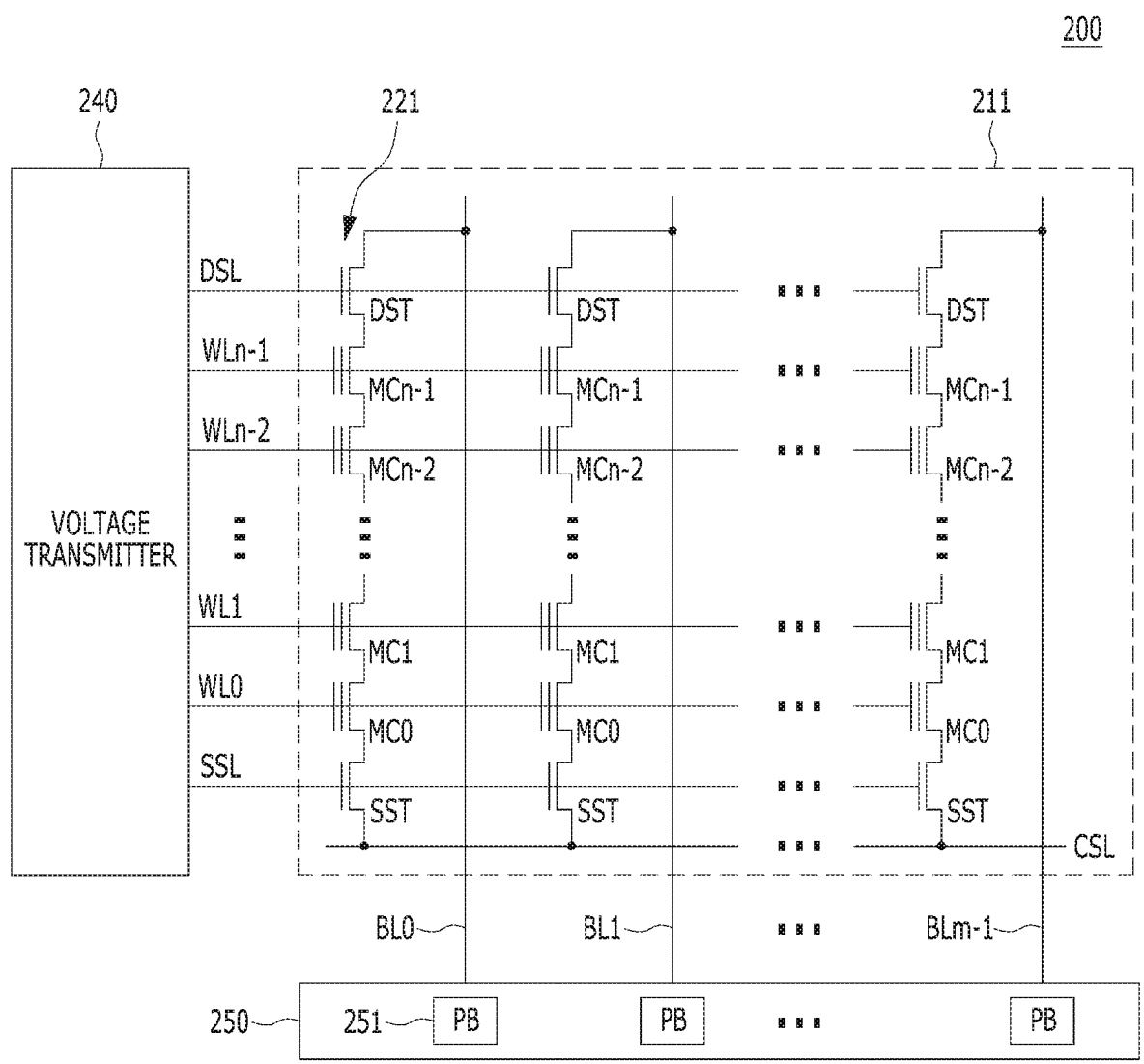
FIG. 4B is a circuit diagram illustrating a memory block, such as that shown in FIG. 4A.

FIG. 4B is a circuit diagram illustrating a memory block 211 shown in FIG. 4A.

Figure 5:
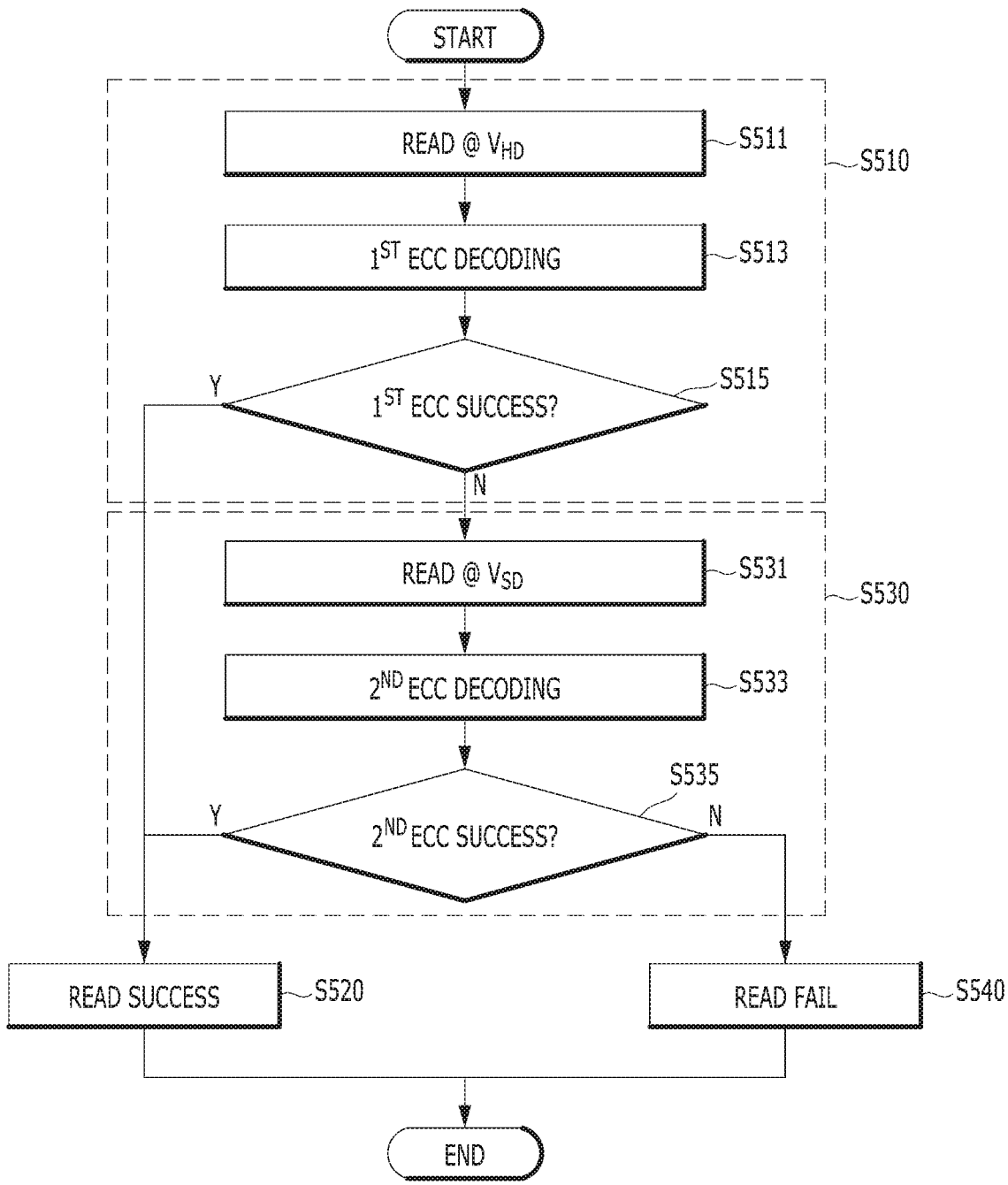
FIG. 5 is a flowchart illustrating an operation of a memory controller, such as that shown in FIG. 4A.

FIG. 5 is a flowchart illustrating an operation of a memory controller 100 included in the semiconductor memory system 10.

Referring to FIGS. 3 to 5, the semiconductor memory system 10 may include the memory controller 100 and a semiconductor memory device 200.

The semiconductor memory device 200 may perform one or more of erase, program, and read operations under the control of the memory controller 100. The semiconductor memory device 200 may receive a command CMD, an address ADDR and data DATA through input and output lines. The semiconductor memory device 200 may be provided with power PWR through a power line and receive a control signal CTRL through a control line. The control signal may include a command latch enable (CLE) signal, an address latch enable (ALE) signal, a chip enable (CE) signal, a write enable (WE) signal, and a read enable (RE) signal.

The memory controller 100 may control overall operations of the semiconductor memory device 200. The memory controller 100 may include a low-density parity check (LDPC) unit 130 for correcting error bits. The LDPC unit 130 may include a LDPC encoder 131 and a LDPC decoder 133.

The LDPC encoder 131 may perform error correction encoding on data to be programmed into the semiconductor memory device 200 to output data to which parity bits are added. The parity bits may be stored in the semiconductor memory device 200.

The LDPC decoder 133 may perform error correction decoding on data read from the semiconductor memory device 200. The LDPC decoder 133 may determine whether the error correction decoding is successful, and may output an instruction signal based on the determination result. The LDPC decoder 133 may correct error bits of data using the parity bits generated by the LDPC encoding operation.

When the number of error bits exceeds error correction capacity of the LDPC unit 130, the LDPC unit 130 may not correct the error bits. In this case, the LDPC unit 130 may generate an error correction fail signal.

The LDPC unit 130 may correct an error through the LDPC code. The LDPC unit 130 may include all circuits, systems, or devices for error correction. The LDPC code may be a binary LDPC code or a non-binary LDPC code.

In accordance with an embodiment of the present invention, the LDPC unit 130 may perform an error bit correcting operation using hard decision read data and soft decision read data.

The memory controller 100 and the semiconductor memory device 200 may be integrated in a single semiconductor device to form a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

In another embodiment, the memory controller 100 and the semiconductor memory device 200 may be integrated in a single semiconductor device to configure a memory card, such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

For another example, the semiconductor memory system 10 may be provided as one of various elements comprising an electronic device such as a computer, an ultra-mobile personal computer (PC) (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, the memory controller 100 may include a storage 110, a central processing unit (CPU) 120, the LDPC unit 130, a host interface (I/F) 140, a memory interface 150 and a system bus 160. The storage 110 may operate as a working memory of the CPU 120.

The host interface 140 may communicate with a host through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The LDPC unit 130 may detect and correct errors included in the data read from the semiconductor memory device 200. The memory interface 150 may interface with the semiconductor memory device 200. The LDPC encoder 131 and the LDPC decoder 133 may be implemented as different and independent components even though FIG. 4A exemplarily shows the LDPC unit 130 including both of the LDPC encoder 131 and the LDPC decoder 133. The CPU 120 may perform various control operations.

In accordance with an embodiment of the present invention, during the program operation, the LDPC unit 130 may perform a LDPC encoding to an original data which is to be programmed to the semiconductor memory device 200. In such case, during the read operation, the LDPC unit 130 may perform a LDPC decoding to the LDPC-encoded data or a codeword, which is stored in the semiconductor memory device 200.

The LDPC unit 130 may restore the original data, which is the state of the data before the LDPC encoding operation was performed on it during the program operation, by performing the LDPC decoding operation to the LDPC-encoded data or the codeword stored in the semiconductor memory device 200.

As discussed with reference to FIG. 5, the read operation to the data stored in the semiconductor memory device 200 may include a hard decision read operation of step S511 and a soft decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which are different voltages than the hard decision read voltage $V_{HD}$. For example, an additional read operation according to the soft decision read voltages $V_{SD}$ may be performed to the memory cell, which is first read according to the hard decision read voltage $V_{HD}$.

The LDPC-encoded data or the codeword, which is stored in the semiconductor memory device 200 and is read through the hard decision read operation, may be decoded back to the original data by the LDPC unit 130.

The soft decision read operation generates a log-likelihood ratio (LLR), which provides an indication of the reliability of the hard decision read data read through the hard decision read operation, according to the soft decision read voltages $V_{SD}$.

The LDPC unit 130 may perform the LDPC decoding operation to the LLR. The LDPC unit 130 may detect and correct the error of the LDPC-encoded data or the codeword read from the semiconductor memory device 200 through the LLR.

The semiconductor memory device 200 may include a memory cell array 210, a control circuit 220, a voltage supply 230, a voltage transmitter 240, a read and write (read/write) circuit 250, and a column selector 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm−1, respectively. Each of the cell strings 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data (or information) of multiple bits in each cell. The cell strings 221 may be electrically coupled to the corresponding bit lines BL0 to BLm−1, respectively.

FIG. 4B exemplarily illustrates a memory block 211 comprising a NAND-type flash memory cell. However, the memory block 211 of the semiconductor memory device 200 is not limited to being NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply 230 may provide word line voltages, for example, a program voltage, a read voltage, and a pass voltage, to the respective word lines according to an operation mode. Further, the voltage supply 230 may provide a voltage to be supplied to a bulk, for example, a well region in which the memory cells are formed. A voltage generating operation of the voltage supply circuit 230 may be performed under control of the control circuit 220.

The voltage supply 230 may generate a plurality of variable read voltages for generating a plurality of read data.

The voltage transmitter 240 may select one of the memory blocks 211 or sectors of the memory cell array 210, and may select one of the word lines of the selected memory block under the control of the control circuit 220. The voltage transmitter 240 may provide the word line voltage generated from the voltage supply 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selector 260 may output the data read from the read/write circuit 250 to the outside, for example, to the memory controller 100, based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a hard decision decoding step S510, and may additionally include a soft decision decoding step S530. In accordance with an embodiment of the present invention, the soft decision decoding step S530 may be performed repeatedly based on the number of read operations and precision information of soft decision read data. The target data to which the hard and soft decision decoding steps S510 and S530 are applied may be the LDPC-encoded data or the codeword, which is LDPC-encoded by the LDPC unit 130.

The hard decision decoding step S510 may include applying hard decision LDPC decoding to data of a set or predetermined length, which is read from a memory cell of the memory block 211 according to the hard decision read voltage $V_{HD}$. The hard decision decoding step S510 may include steps S511 to S515.

The soft decision decoding step S530 may include applying LDPC decoding to form soft decision read data according to soft decision read voltages $V_{SD}$ around the hard decision read voltage $V_{HD}$ when the hard decision LDPC decoding finally fails. The soft decision decoding step S530 may include steps S531 to S535.

As described above, at step S511 of the hard decision read step, data may be read from the semiconductor memory device 200 according to the hard decision read voltage $V_{HD}$. The memory controller 100 may provide a read command and an address to the semiconductor memory device 200. The semiconductor memory device 200 may read the data therefrom according to the hard decision read voltage $V_{HD}$ in response to the read command and the address. The read data may be provided to the memory controller 100.

At step S513, the hard decision decoding, e.g., hard decision LDPC decoding, may be performed. The LDPC unit 130 may perform the hard decision LDPC decoding on the data read from the semiconductor memory device 200 according to the hard decision read voltage $V_{HD}$ by using the error correction code.

At step S515, it may be determined whether the hard decision LDPC decoding (or first ECC decoding) succeeded or failed. That is, at step S515, it may be determined whether an error of the read data, to which the hard decision LDPC decoding is performed at step S513, is corrected. For example, the memory controller 100 may determine whether an error of the read data is corrected by using the hard decision read data and a parity check matrix. For example, when product result of the parity check matrix and the hard decision read data is a zero vector ('$\underline{0}$'), it may be determined that the hard decision read data is corrected. On the other hand, when product result of the parity check matrix and the hard decision read data is not the zero vector ('$\underline{0}$'), it may be determined that the hard decision read data is not corrected.

When it is determined that the hard decision read data is corrected as a result of the determination of step S515, that may indicate that the read operation according to hard decision read voltage $V_{HD}$ at step S511 was successful (step S520) and the operation of the memory controller 100 may end. The hard decision read data, as a result of the hard decision LDPC decoding performed at step S513, may be now the error-corrected data and may be provided externally or used in the memory controller 100.

When it is determined that the hard decision read data is not corrected as a result of the determination of step S515 (S515, N), the soft decision decoding step S530 may be performed.

As described above, at the soft decision read step S531, data may be read from the semiconductor memory device 200 according to the soft decision read voltages $V_{SD}$. For example, the additional read operations according to the soft decision read voltages $V_{SD}$ may be performed on the memory cell, to which the hard decision decoding step S510 is performed according to the hard decision read voltage $V_{HD}$. The soft decision read voltages $V_{SD}$ may be different than the hard decision read voltage $V_{HD}$.

At step S533, the soft decision decoding, e.g., soft decision LDPC decoding, may be performed. The soft decision LDPC decoding may be performed based on the result of the hard decision LDPC decoding and data read from the memory cell according to the soft decision read voltages $V_{SD}$. The hard decision read voltage $V_{HD}$ and the soft decision read voltages $V_{SD}$ may be different.

For example, each of the memory cells MC0 to MCn−1 of the semiconductor memory device 200 may belong to one of the threshold voltage distributions including 7 program states P1 to P7 and 1 erase state E.

The hard decision read voltage $V_{HD}$ may be between 2 neighbouring states of the plurality of states (E and P1 to P7). Each of the soft decision read voltages $V_{SD}$ may be between 2 neighbouring states of the plurality of states (E and P1 to P7), which is different from the hard decision read voltage $V_{HD}$.

The read data read from the memory cells MC0 to MCn−1 according to the hard decision read voltage $V_{HD}$ and according to the soft decision read voltages $V_{SD}$ may have different values. For example, there may be tailed memory cell among the memory cells MC0 to MCn−1 having the threshold voltage higher or lower than the threshold voltage distribution of the normal logic state. The data read from the tailed memory cell according to the hard decision read voltage $V_{HD}$ and according to the soft decision read voltages $V_{SD}$ may have different values. When the additional read operation according to the soft decision read voltages $V_{SD}$ is performed in addition to the read operation according to the hard decision read voltage $V_{HD}$, additional information on the threshold voltages of the memory cells MC0 to MCn−1 (i.e., additional information on the tailed memory cells) or the log likelihood ratio (LLR) providing reliability of the hard decision read data read by the hard decision read operation may be obtained.

When the additional information is obtained, the probability of whether the data of the memory cells MC0 to MCn−1 belong to the first state (i.e., '1'), or the second state (i.e., '0'), may increase. That is, the reliability of the LDPC decoding may increase. The memory controller 100 may perform the soft decision LDPC decoding based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 7A and 7B.

At step S535, it may be determined whether the soft decision LDPC decoding (or second ECC decoding) succeeded or failed. That is, at step S535, it may be determined whether an error of the soft decision read data, as a result of the soft decision LDPC decoding performed at step S533, is corrected. For example, the memory controller 100 may determine whether an error of the soft decision read data is corrected by using the soft decision read data and the parity check matrix. For example, when product result of the parity check matrix and the soft decision read data is the zero vector ('$\underline{0}$'), it may be determined that the soft decision read data is corrected. On the other hand, when product result of the parity check matrix and the soft decision read data is not the zero vector ('$\underline{0}$') it may be determined that the soft decision read data is not corrected.

The product process of the parity check matrix and the hard decision read data during the hard decision decoding step S510 may be the same as the product process of the parity check matrix and the soft decision read data during the soft decision decoding step S530.

When it is determined that the soft decision read data is corrected as the result of determination of step S535 (S535, Y), it may be determined at step S520 that the read operation according to soft decision read voltage $V_{SD}$ at step S531 was successful and the operation of the memory controller 100 may end. The soft decision read data, as a result of the soft decision LDPC decoding performed at step S533, may be now the error-corrected data and may be provided externally or used in the memory controller 100.

When it is determined that the soft decision read data is not corrected as the result of determination of step S535 (S535, N), it may be determined at step S540 that the read operation of the memory controller 100 to the memory cells MC0 to MCn−1 finally failed and the operation of the memory controller 100 may end.

Figure 6A:
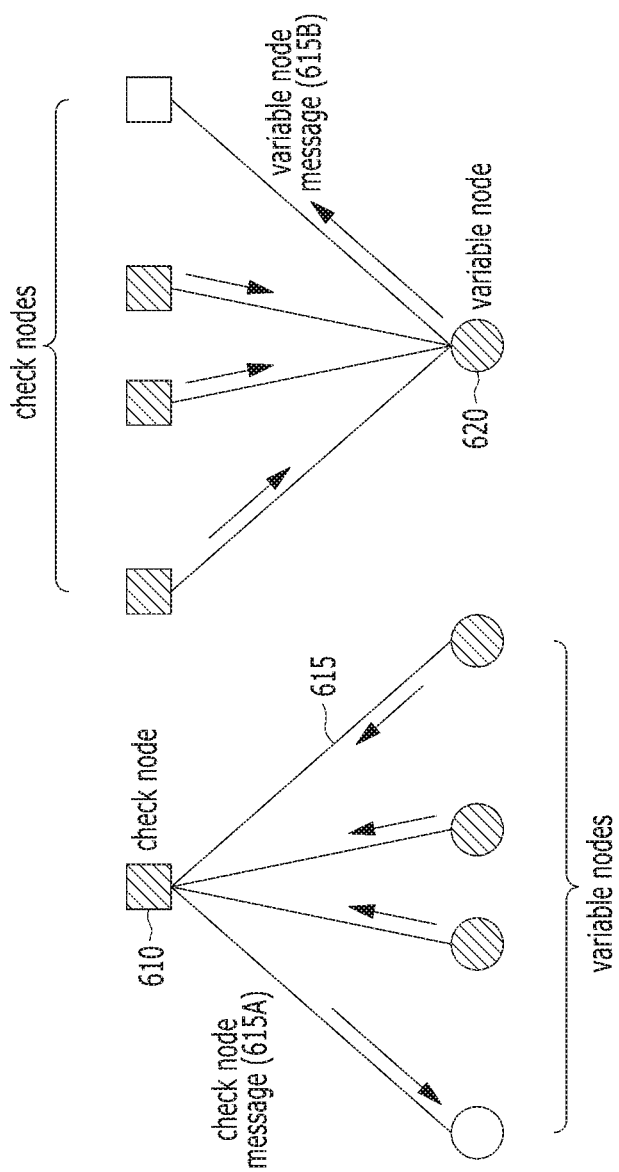
FIG. 6A is a schematic diagram illustrating a low-density parity-check (LDPC) decoding represented by a tanner graph.

FIG. 6A is a schematic diagram illustrating a low-density parity-check (LDPC) decoding represented by a tanner graph.

FIG. 6B is a schematic diagram illustrating an LDPC code.

FIG. 6C is a schematic diagram illustrating a syndrome check process according to the LDPC decoding.

An error correction code (ECC) is commonly used in storage systems. Various physical phenomena occurring in storage devices result in noise effects that corrupt the stored information. Error correction coding schemes can be used for protecting the stored information against the resulting errors. This is done by encoding information and then storing the information in a memory device. The encoding process transforms the information into a codeword by adding redundancy to the information. This redundancy can then be used to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code can be defined using a bipartite graph or a tanner graph describing interconnections between the constituent codes. In this case, decoding can be viewed as an iterative message passing over the graph edges.

The iterative codes may include the low-density parity-check (LDPC) code. The LDPC code is a linear binary block code defined by a sparse parity-check matrix H.

Referring to FIG. 6A, the LDPC code has a parity check matrix in which the number of non-binary elements except '0' in each row and column is very small. The structure of the LDPC code may be defined by the tanner graph including check nodes 610, variable nodes 620, and edges 615 connecting the check nodes 610 to the variable nodes 620. A value delivered from one of the check nodes 610 to one of the variable nodes 620 after check node processing becomes a check node message 615A. A value delivered from one of the variable nodes 620 to one of the check nodes 610 after variable node processing becomes a variable node message 615B.

A decoding process of the LDPC code is performed by iterative decoding based on a 'sum-product' algorithm. A decoding method may be provided based on a suboptimal message-passing algorithm such as a 'min-sum' algorithm, which is a simplified version of the sum-product algorithm.

Referring to FIG. 6B, the tanner graph of the LDPC code includes 5 check nodes (C1 to C5) 610 representing parity check equations of the LDPC code, 10 variable nodes (V1 to V10) 620 representing code symbols, and edges 615 representing relationships between the check nodes 610 and the variable nodes 620. The edges 615 connect each of the check nodes 610 to each of the variable nodes 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes coupled to each of the variable nodes 620 is fixed at 2. An initial value of each of the variable nodes 620 may be one of the hard decision read data and the soft decision read data.

FIG. 6C shows a parity check matrix H corresponding to the tanner graph. The parity check matrix H is similar to the graphic expression of the parity check equations. The parity check matrix H has the same number of is in each column and each row. That is, each column of the parity check matrix H has two is corresponding to the connections between each of the variable nodes 620 and the check nodes 610, and each row has four is corresponding to the connections between each of the check nodes 610 and the variable nodes 620.

A process of decoding the LDPC code is performed by an iterative process of exchanging messages, which are generated and updated in each node, between the variable nodes 620 and the check nodes 610 in the tanner graph. In this case, each node updates the messages based on the sum-product algorithm or a similar suboptimal algorithm.

For example, the LDPC decoding may comprise a plurality of iterations, each of which includes update of the check nodes, update of the variable nodes, and a syndrome check after an initial update of the variable nodes. After the single iteration, when the result of the syndrome check satisfies a specific condition, the LDPC decoding may end. When the result of the syndrome check does not satisfy the specific condition, an additional single iteration may be performed. The additional iteration may include a check node update, a variable node update and the syndrome check. The number of iterations may be limited to a maximum iteration count. When the result of the syndrome check does not satisfy the specific condition until the number of iterations reaches the maximum iteration count, the LDPC decoding on the codeword may be determined to have failed in LDPC decoding.

Referring to FIG. 6C, the syndrome check is a process of identifying whether the product result "$H\underline{v}$'" of the parity check matrix H and a vector "$\underline{v}$", which is obtained by the update of the variable nodes, satisfies the specific condition. When the product result "$H\underline{v}$'" becomes the zero vector, the product result "$H\underline{v}$'" may be deemed to satisfy the specific condition.

FIG. 6C shows the syndrome check process. FIG. 6C exemplarily shows a non-zero vector "01000" as the product result "$H\underline{v}$'", and thus FIG. 6C shows that the syndrome check does not satisfy the specific condition and another single iteration should be performed.

Considering the non-zero vector "01000" as the product result "$H\underline{v}$'", the number of non-zero vector elements or elements that do not meet the zero vector condition, is 1. In the description, each element that does not meet the zero vector condition of the syndrome check for the product result "$H\underline{v}$'" in a given iteration is defined as an unsatisfied syndrome check (USC). FIG. 6C shows the result of the syndrome check where the number of the USC is 1.

Figure 7A:
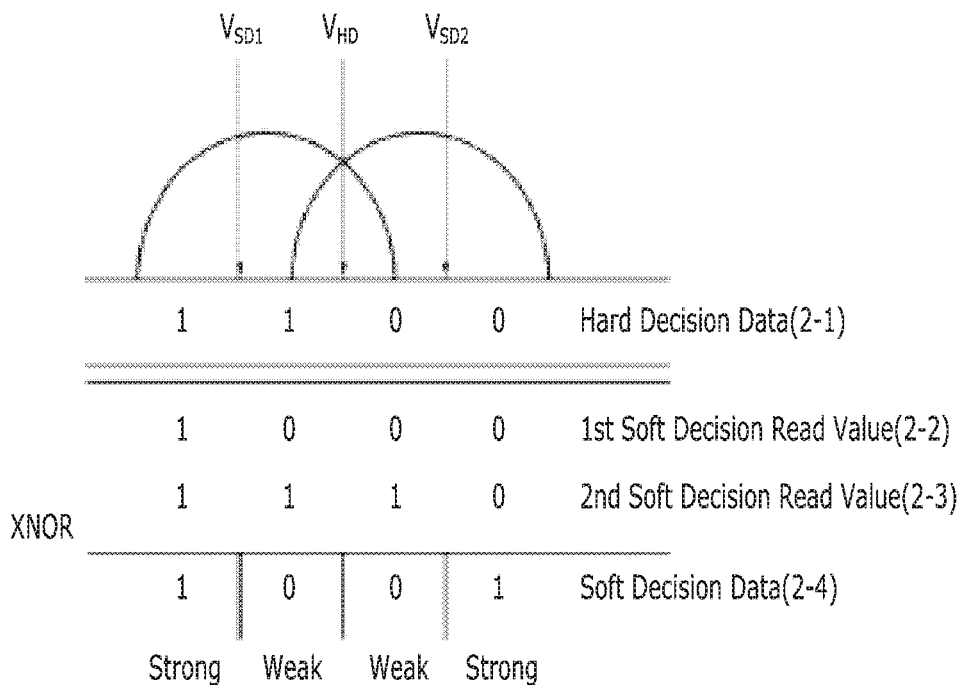
FIGS. 7A and 7B are schematic diagrams illustrating a soft decision read operation, such as that shown in FIG. 5.
Figure 7B:
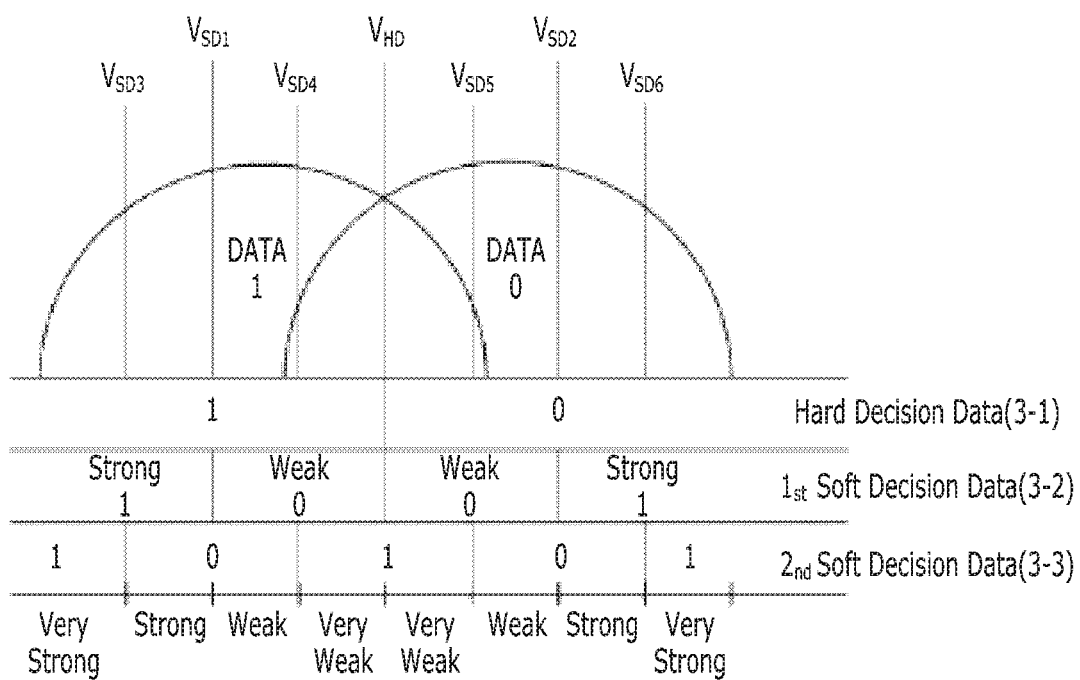

FIGS. 7A and 7B are schematic diagrams illustrating the soft decision read operation shown in FIG. 5, particularly 2-bit and 3-bit soft decision read operations, respectively.

Referring to FIG. 7A, during the hard decision decoding operation step S510 described with reference to FIG. 5, the hard decision read data 2-1 may have one of values '1' and '0' according to an on/off status of a memory cell when the hard decision read voltage $V_{HD}$ is applied to the semiconductor memory device 200 of FIG. 4A.

During the soft decision decoding operation step S530, the log-likelihood ratio (LLR) may be generated through the soft decision read operation where the soft decision read voltages $V_{SD1}$ and $V_{SD2}$, which have different voltages from the hard decision read voltage $V_{HD}$, are applied to the memory cell.

During the 2-bit soft decision read operation, a first soft decision read value 2-2 may be '1000' according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ is applied to the memory cell.

For example, the LDPC unit 130 may generate a soft decision read data 2-4 (or the LLR) through a logic operation (e.g., XNOR operation) to the first and second soft decision read values 2-2 and 2-3. The LLR may show reliability of the hard decision read data 2-1.

For example, the soft decision read data 2-4 having the value '1' may show a "strong" probability that the hard decision read data 2-1 has the first or second statuses (the logic values of '1' or '0'). On the other hand, the soft decision read data 2-4 having the value '0' may show a "weak" probability that the hard decision read data 2-1 has the first or second statuses.

Referring to FIG. 7B, during the hard decision decoding operation step S510 described with reference to FIG. 5, the hard decision read data 3-1 may have a value of '1' or '0' according to the on/off status of the memory cell when the hard decision read voltage $V_{HD}$ is applied to the semiconductor memory device 200 of FIG. 4A.

During the soft decision decoding operation step S530, the LLR may be generated through the soft decision read operation where the soft decision read voltages $V_{SD1}$ to $V_{SD6}$, which may be different than the hard decision read voltage $V_{HD}$, are applied to the memory cell.

During the 3-bit soft decision read operation, first and second soft decision read values may be generated according to the on/off status of a memory cell when first and second soft decision read voltages $V_{SD1}$ and $V_{SD2}$ are applied to the memory cell, which is similar to the 2-bit soft decision read operation described with reference to FIG. 7A. The LDPC unit 130 may generate a first soft decision read data 3-2 (e.g., '1001') (or the LLR) through a logic operation (e.g., the XNOR operation) to the first and second soft decision read values.

In a similar way, during the 3-bit soft decision read operation, third to sixth soft decision read values may be generated according to the on/off status of the memory cell when third to sixth soft decision read voltages $V_{SD3}$ to $V_{SD6}$, which are different than the first and second soft decision read voltages $V_{SD1}$ and $V_{SD2}$, are applied to the memory cell, which is similar to the 2-bit soft decision read operation described with reference to FIG. 7A. The LDPC unit 130 may generate a second soft decision read data 3-3 ('10101') or data used for generating the LLR through the XNOR operation to the third to sixth soft decision read values. The second soft decision read data 3-3 ('10101') may provide a weighted value to the first soft decision read data 3-2.

For example, in the case in which a value of the first soft decision data 3-2 is ("strong" probability), the value of the corresponding bit of the second soft decision read data 3-3 may weight that probability to be "very strong.". On the other hand, the value '0' of the corresponding bit of the second soft decision read data 3-3 may indicate no weighting, that is, the probability remains "strong.".

In a similar way, in the case in which a value of the first decision data 3-2 is '0' ("weak" probability), the value of '1' of the corresponding bit of the second soft decision read data 3-3 may weight that probability to be "very weak." On the other hand, the value '0' of the corresponding bit of the second soft decision read data 3-3 may indicate no weighting, that is, the probability remains "weak." Thus, the second soft decision read data 3-3 may provide a better reliability to the hard decision read data 3-1, which is similar to the 2-bit soft decision read operation described with reference to FIG. 7A.

Figure 8:
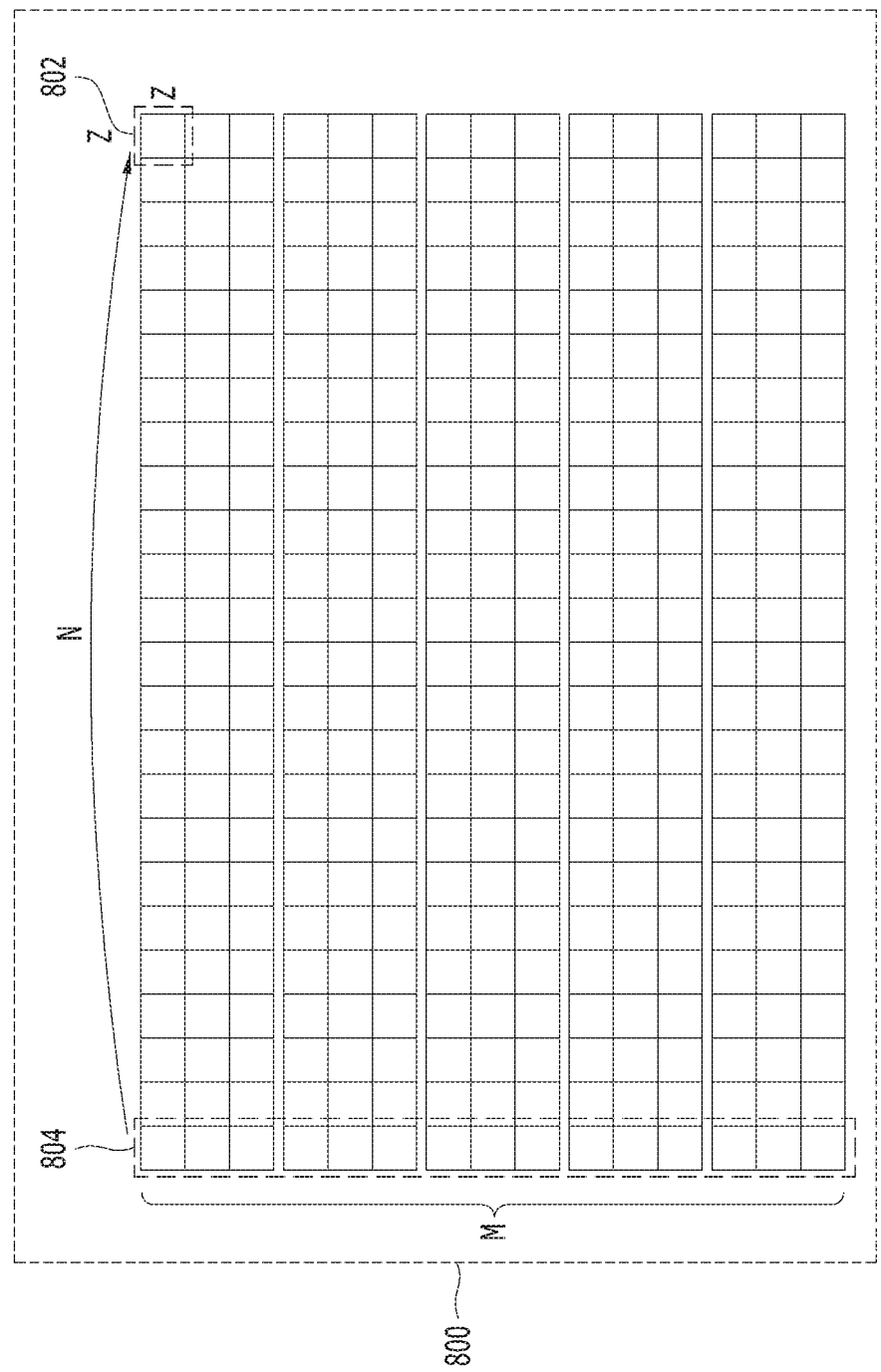
FIG. 8 illustrates a parity check matrix in accordance with an embodiment of the present invention.

FIG. 8 illustrates a parity check matrix 800 in accordance with an embodiment of the present invention.

Referring to FIG. 8, the parity check matrix 800 may include a plurality of sub-matrices (e.g., M*N sub-matrices). A sub-matrix 802 may be a zero matrix or a cyclically shifted identity matrix of a Z*Z dimension.

Each component of the parity check matrix 800 defining a non-binary LDPC code may be determined as one among the non-binary elements on a non-binary finite field GF(q). The non-binary LDPC code may be defined as a case where the q of the non-binary finite field GF(q) has a value greater than 2, and the q may be the number of non-binary elements forming the non-binary finite field GF(q).

As described above with reference to FIG. 6A, the structure of the non-binary LDPC code may be defined by a Tanner graph that includes check nodes 610, variable nodes 620, and edges 615 coupling the check nodes 610 and the variable nodes 620.

The check nodes 610 and the variable nodes 620 forming the Tanner graph may correspond to the rows and columns of the parity check matrix 800, respectively. Therefore, the number of the rows of the parity check matrix 800 and the number of the columns of the parity check matrix 800 may coincide with the number of the check nodes 610 and the number of the variable nodes 620 of the Tanner graph, respectively. When a component of the parity check matrix 800 has a value that is not zero, one of the check nodes 610 and one of the variable nodes 620 corresponding to the row and the column where the component is positioned may be coupled to one of the edges 615.

The decoding of the non-binary LDPC code may be generally performed by using a q-ary sum-product algorithm (QSPA) or an extended min-sum algorithm (SMSA) which is a simplified version of the q-ary sum-product algorithm (QSPA).

As described above with reference to FIG. 6A, the non-binary LDPC decoding may include as one iteration (iteration unit) a check node update operation, a variable node update operation, and a syndrome check operation after the initial update operation of the variable node 620. During one iteration unit, one of the variable nodes 620 and one of the check nodes 610 on the Tanner graph may exchange messages generated and updated for each node.

A conventional non-binary LDPC decoding algorithm may perform the check node update operation, the variable node update operation, and the syndrome check operation by sequentially selecting one of the check nodes 610 corresponding to each row of the parity check matrix 800, whenever one iteration unit is performed, which is performed a plurality of times.

While the operations of one iteration unit are performed, the selected check node 610 may simultaneously provide check node messages 615A to all the variable nodes 620 coupled to the selected check node 610. The variable nodes 620 receiving the check node messages 615A may simultaneously provide the selected check node 610 with variable node messages 615B.

The selected check node 610 may detect the minimum value among the LLRs as a first minimum LLR min1 by sorting out the LLRs included in the variable node messages 615B that are simultaneously provided to the selected check node 610. Further, the selected check node 610 may detect the minimum value among the remaining LLRs excluding the first minimum LLR min1 as a second minimum LLR min2. The selected check node 610 may generate the check node messages 615A based on the detected first minimum LLR min1 and the second minimum LLR min2. Accordingly, the selected check node 610 may require a sorter for sorting out the LLRs included in the variable node messages 6158 that are simultaneously provided to the selected check node 610 to generate the check node messages 615A.

Since the non-binary LDPC code used in a flash memory is designed as a high-rate code having a small amount of parities, the parity check matrix 800 may be designed to have a dimension where the number of the columns (e.g., N*Z) is greater than the number of the rows (e.g., M*Z). As a result, there are many variable nodes 620 coupled to each of the check nodes 610, and also, there are many variable node messages 615B that are simultaneously provided to the selected check node 610 while the operations of one iteration unit are performed in the non-binary LDPC decoding algorithm. When there are many variable node messages 615B that are simultaneously provided to the selected check node 610, the sorter is required to sort out more LLRs during one iteration unit. Therefore, the complexity of the sorter may be increased while the decoding convergence speed may be decreased.

In accordance with an embodiment of the present invention, the non-binary LDPC decoding algorithm may select a variable node 620 corresponding to each column of the parity check matrix 800 each time one iteration unit is performed, which is performed a plurality of times. Then, the variable node 620 simultaneously provides the variable node messages 615B to all the check nodes 610 coupled to the selected variable nodes 620. According to an embodiment of the present invention, each of the check nodes 610 coupled to the selected variable nodes 620 may generate the check node messages 615B by detecting the first minimum LLR min1 and the second minimum LLR mint only with the LLRs provided from the selected variable nodes 620 among all the variable nodes 620 coupled to each of the check nodes 620 during one iteration unit. Therefore, a sorter with high complexity is not required, and the decoding convergence speed may be increased.

Figure 9:
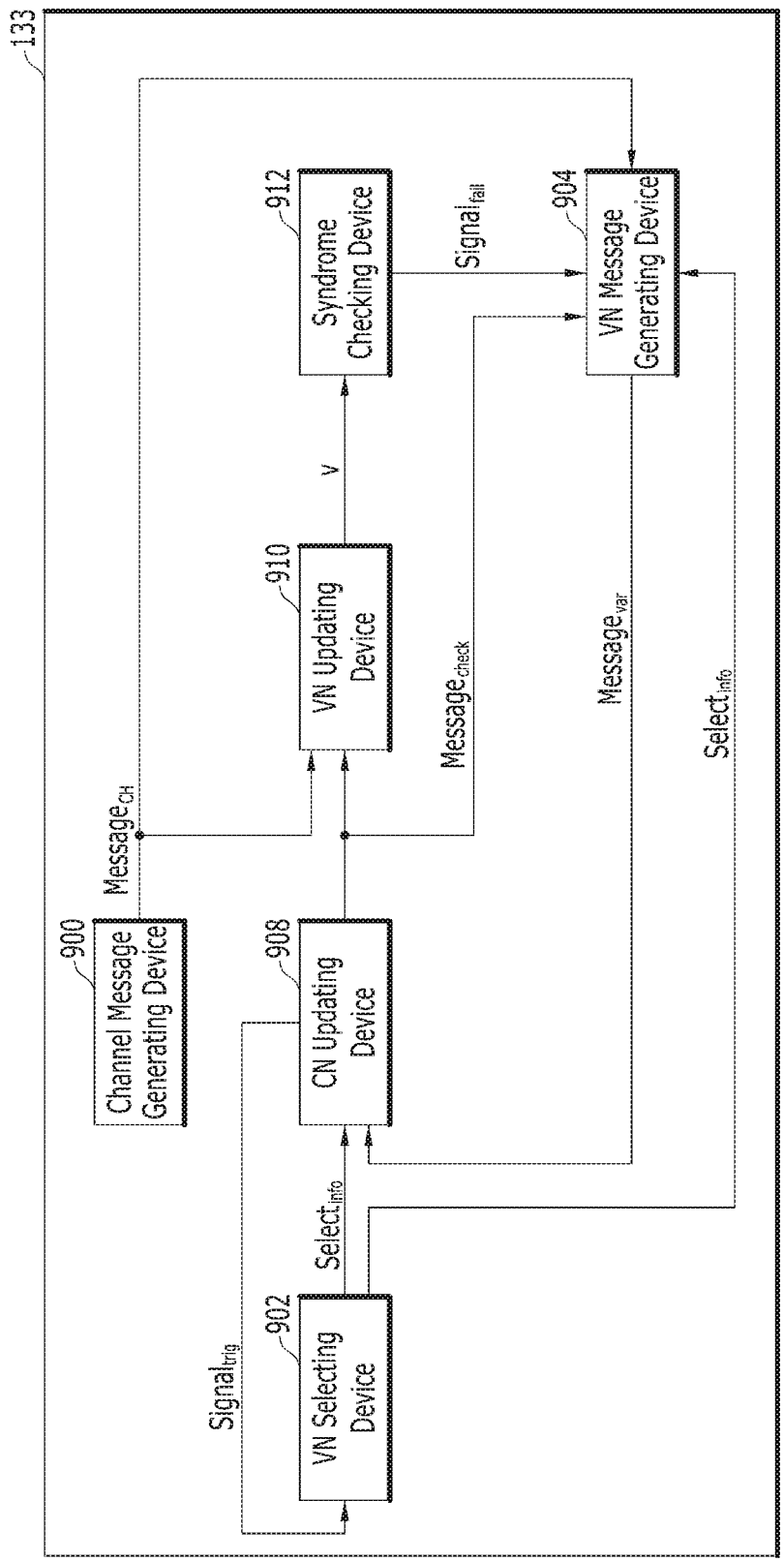
FIG. 9 is a block diagram illustrating a Low-Density Parity Check (LDPC) decoder, such as that shown in FIGS. 3 and 4A.

FIG. 9 is a block diagram illustrating a low density parity check (LDPC) decoder 133 shown in FIGS. 3 and 4A.

As described above with reference to FIG. 3, the LDPC encoder 131 may encode data to be programmed into the semiconductor memory device 200 to form a code word. The code word may be stored in the semiconductor memory device 200. The LDPC decoder 133 may perform error correction decoding on the code word which is read from the semiconductor memory device 200. The semiconductor memory device 200 and the LDPC decoder 133 may be coupled to each other through a channel, and the semiconductor memory device 200 may provide the LDPC decoder 133 with the code word through the channel.

Referring to FIG. 9, the LDPC decoder 133 may include a channel message generating device 900, a variable node (VN) selecting device 902, a variable node (VN) message generating device 904, a check node (CN) updating device 908, a variable node (VN) updating device 910, and a syndrome checking device 912.

The channel message generating device 900 may generate a channel message $Message_{CH}$ from the code word provided from the semiconductor memory device 200. The channel message $Message_{CH}$ may include a channel symbol $Symbol_{CH}$ and a channel LLR vector $LLR_{CH}$. The channel message $Message_{CH}$ may be represented by a (q*1)-dimensional vector. The component positioned in a first row of the channel message $Message_{CH}$ may be the channel symbol $Symbol_{CH}$. The components positioned in second to $q^{th}$ rows of the channel message $Message_{CH}$ may be the channel LLR vector $LLR_{CH}$.

The channel message generating device 900 may detect a symbol of the highest reliability among the symbol candidates of the variable nodes 620 respectively corresponding to the columns of the parity check matrix 800 from the code word that is read through the hard-decision read operation described earlier with reference to FIG. 5 as the channel symbol $Symbol_{CH}$.

The channel message generating device 900 may normalize all the components included in the channel message $Message_{CH}$ such that the LLR of the detected channel symbol $Symbol_{CH}$ has a value of '0'. The channel message generating device 900 may generate the LLRs of the remaining (q−1) non-binary elements excluding the detected channel symbol $Symbol_{CH}$ among the non-binary elements on the non-binary LDPC finite field GF(q) as the channel LLR vector $LLR_{CH}$. The channel message generating device 900 may provide the generated channel message $Message_{CH}$ to the variable node message generating device 904 and the variable node updating device 910.

As described above with reference to FIG. 5, the soft-decision read operation may refer to an operation of generating the LLR, which is information capable of adding reliability to data of the hard-decision read operation. However, the channel message generating device 900 may generate the channel LLR vector $LLR_{CH}$ only with the code word that is read through the hard-decision read operation. Therefore, the non-binary LDPC decoding algorithm in accordance with an embodiment of the present invention may be applied to both of the hard-decision LDPC decoding (the step S513) and the soft-decision LDPC decoding (the step S530), which are described above with reference to FIG. 5.

The variable node selecting device 902 may generate variable node selection information $Select_{info}$ by selecting the variable nodes 620 corresponding to each column of the parity check matrix 800 every time one iteration unit is performed. As described above with reference to FIG. 8, the parity check matrix 800 may include the (M*N) sub-matrices 802, and the variable node selecting device 902 may select one layer 804 among the N layers 804 of the parity check matrix 800 every time one iteration unit is performed. According to another embodiment of the present invention, the variable node selecting device 902 may simultaneously select the multiple layers 804 when the number of components whose value is not '0' is one or less among the components included in the rows forming each of the selected multiple layers 804 of the parity check matrix 800.

As the variable node selecting device 902 selects a layer 804 of the parity check matrix 800, the variable node selecting device 902 may select the M sub-matrices 802 included in the selected layer 804. As described above with reference to FIG. 8, the sub-matrix 802 may be a zero matrix or a cyclically shifted identity matrix of a (Z*Z) dimension. Accordingly, the selected M sub-matrices 802 may form a matrix of an (M*Z)*(Z) dimension, and the variable node selecting device 902 may select Z variable nodes 620 by selecting the layer 804 of the parity check matrix 800.

Among the Z components sharing each row of the cyclically shifted identity matrix 802 of the Z*Z dimension, only one component may have a value that is not '0'. Therefore, the number of the components whose value is not '0' among the Z components sharing the same row in each of the M sub-matrices selected from the parity check matrix 800 may not be two or more. As described above with reference to FIG. 8, when a component of the parity check matrix 800 has a value that is not '0', the check node 610 and the variable node 620 respectively corresponding to the row and the column in which the component is positioned may be coupled to the edge 615. Therefore, the number of the variable nodes coupled to the same check node 610 among the selected Z variable nodes may not be two or more.

However, there may be two or more components whose value is not '0' among the M*Z components sharing the same column in M sub-matrices 802 selected from the parity check matrix 800. Accordingly, each of the selected Z variable nodes may be coupled to two or more check nodes 610. In other words, although the selected Z variable nodes 620 may be coupled to the multiple check nodes 610, the selected Z variable nodes 620 may not be coupled to the same check node 610. When the variable node messages 615B are provided from the selected variable nodes 620 to the check nodes 610 coupled to each of the selected variable nodes 620, the check nodes 610 may be provided with a variable node message 615B from one variable node at most.

The variable node selecting device 902 may generate the variable node selection information $Select_{info}$ for the selected variable nodes 620 based on a trigger signal $Signal_{trig}$. Further, the variable node selecting device 902 may provide the check node updating device 908 and the variable node message generating device 904 with the generated variable node selection information $Select_{info}$.

The check node updating device 908 may generate check node messages $Message_{check}$ that are provided from the check nodes 610, respectively coupled to the selected variable nodes 620, to the selected variable nodes 620 based on the provided variable node selection information $Select_{info}$, which will be described later. Further, the check node updating device 908 may provide the variable node message generating device 904 and the variable node updating device 910 with the generated check node messages $Message_{check}$.

The variable node updating device 910 may update the symbols of each of the selected variable nodes 620 by using the provided channel message $Message_{CH}$ and the check node messages $Message_{check}$. The variable node updating device 910 may perform an initial variable node updating operation of initializing the symbols of the selected variable nodes 620 with the channel symbol $Symbol_{CH}$. The variable node updating device 910 may calculate a natural number sum of the LLRs that are included in a check node LLR vector $LLR_{check}$ of the check node messages $Message_{check}$ provided from the check nodes 610 coupled to the selected variable nodes 620 and the LLRs that are included in a channel LLR vector $LLR_{ch}$ of the channel message $Message_{CH}$ provided from the channel message generating device 900 for each non-binary element. The variable node updating device 910 may generate the natural number sum of the LLRs calculated for each non-binary element as APP (A Posteriori Probability). A specific method of generating the APP will be described later with reference to FIG. 13.

The variable node updating device 910 may update a non-binary element corresponding to the minimum value among the natural number sums of the LLRs for each of the non-binary elements included in the APP as a symbol $symbol_{var}$ of each of the selected variable nodes. The variable node updating device 910 may update a vector v that includes a symbol of each of the variable nodes 620 on the Tanner graph by updating the symbol of each of the selected variable nodes 620. The variable node updating device 910 may provide the syndrome checking device 912 with the updated vector v.

As described above with reference to FIG. 6C, the syndrome checking device 912 may determine whether or not the result of a product $Hv_t$ operation between the vector v provided from the variable node updating device 910 and the parity check matrix 800 satisfies a specific condition. If a zero vector (0) is obtained as a result of the product operation, it may be determined that the specific condition is satisfied. The syndrome checking device 912 may terminate the non-binary LDPC decoding when it is determined that the specific condition is satisfied. When the syndrome checking device 912 determines that the specific condition is not satisfied, the syndrome checking device 912 may provide the variable node message generating device 904 with a failure signal $Signal_{fail}$.

The variable node message generating device 904 may generate extrinsic information $Extrinsic_{info}$ using the channel message $Message_{CH}$ provided from the channel message generating device 900 and the check node messages $Message_{check}$ provided from the check node message generating device 908 based on the provided variable node selection information $Select_{info}$ and the failure signal $Signal_{fail}$. The variable node message generating device 904 may generate variable node messages $Message_{var}$ from the generated extrinsic information $Extrinsic_{info}$.

Figure 10:
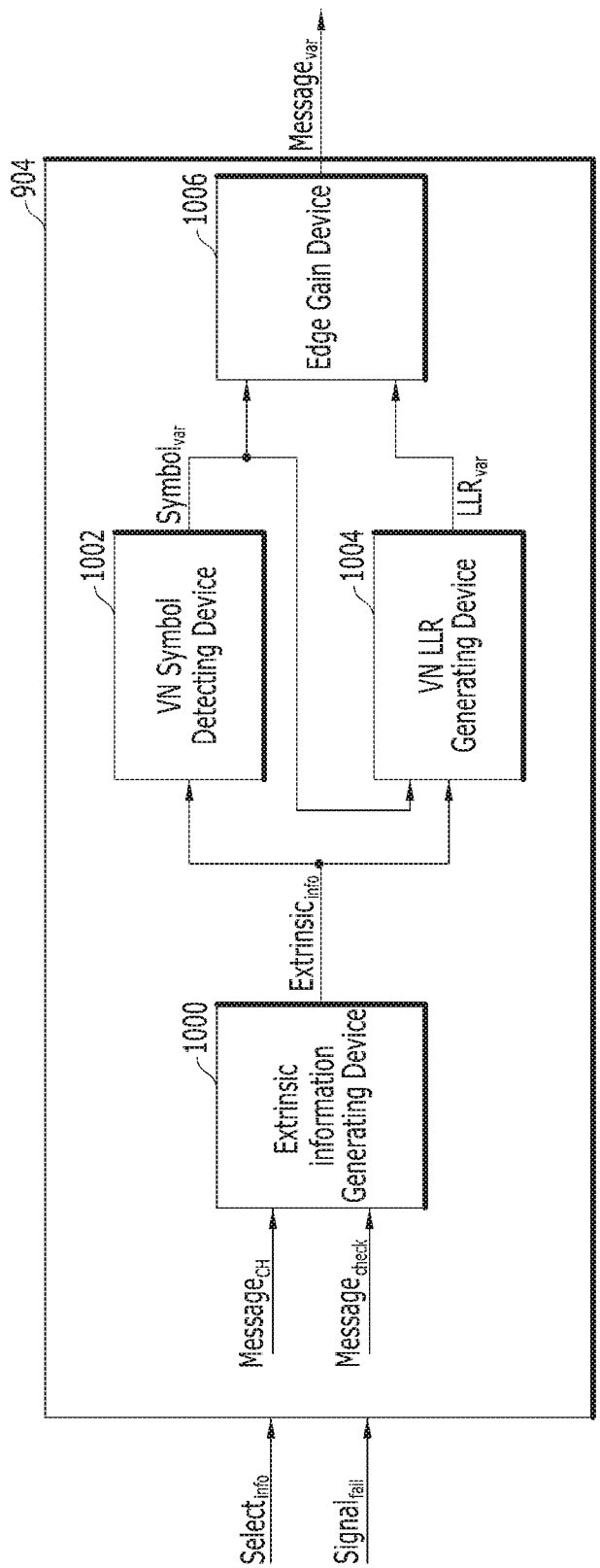
FIG. 10 is a block diagram illustrating a structure of a variable node message generating device.

FIG. 10 is a block diagram illustrating a structure of the variable node message generating device 904 of FIG. 9.

Referring to FIG. 10, the variable node message generating device 904 may include an extrinsic information generating device 1000, a variable node (VN) symbol detecting device 1002, a variable node log likelihood ratio (LLR) generating device 1004, and an edge gain device 1006.

The extrinsic information generating device 1000 may generate the extrinsic information $Extrinsic_{info}$ based on the channel message $Message_{CH}$ provided from the channel message generating device 900 of FIG. 9 and the check node messages $Message_{check}$ provided from the check node updating device 908 of FIG. 9. The extrinsic information generating device 1000 may sequentially select the check nodes to which the variable node messages $Message_{var}$ are to be provided from the selected variable nodes 620 among the check nodes 610 coupled to the selected variable nodes 620. According to an embodiment of the present invention, the extrinsic information generating device 1000 may generate the extrinsic information $Extrinsic_{info}$ by calculating a natural number sum of first LLRs and second LLRs. The first LLRs are included in the check node LLR vector $LLR_{check}$ of the check node messages $Message_{check}$ provided from the remaining check nodes 610 excluding the sequentially selected check nodes among the check nodes 610 coupled to the selected variable nodes 620. The second LLRs are included in the channel LLR vector $LLR_{ch}$ of the channel message $Message_{CH}$ provided from the channel message generating device 900 for each non-binary element. A specific method of calculating the natural sum of the LLRs will be described later with reference to FIG. 14.

According to another embodiment of the present invention, the extrinsic information generating device 1000 may generate the extrinsic information $Extrinsic_{info}$ based on the APP (A Posteriori Probability) generated by the variable node updating device 910 of FIG. 9 and the check node messages $Message_{check}$ provided from the check nodes to which the variable node messages $Message_{var}$ are to be provided from the selected variable nodes 620. The extrinsic information generating device 1000 may generate the extrinsic information $Extrinsic_{info}$ by subtracting, for each non-binary element, the LLRs included in the check node LLR vector $LLR_{check}$ of the check node messages $Message_{check}$ provided from the check nodes to which the variable node messages $Message_{var}$ are to be provided, from the natural number sum of the LLRs for each of the non-binary elements calculated based on the APP. The extrinsic information generating device 1000 may provide the variable node symbol detecting device 1002 and the variable node LLR generating device 1004 with the generated extrinsic information Extrinsic$_{info}$.

The variable node symbol detecting device 1002 may detect a variable node symbol Symbol$_{var}$ from the provided extrinsic information Extrinsic$_{info}$. The variable node symbol detecting device 1002 may sort the natural number sums of the LLRs calculated for each of the non-binary elements to detect a non-binary element corresponding to the minimum value, among the natural number sums of the LLRs, as the variable node symbol Symbol$_{var}$. The variable node symbol detecting device 1002 may provide the variable node LLR generating device 1004 and the edge gain device 1006 with the detected variable node symbol Symbol$_{var}$.

The variable node LLR generating device 1004 may generate a variable node LLR vector LLR$_{var}$ from the provided variable node symbol Symbol$_{var}$ and the extrinsic information Extrinsic$_{info}$. The variable node LLR generating device 1004 may normalize the extrinsic information Extrinsic$_{info}$ so that the LLR of the detected variable node symbol Symbol$_{var}$ has a value of '0'. The variable node LLR generating device 1004 may normalize the extrinsic information Extrinsic$_{info}$ by subtracting the natural number sum of the LLR for the detected variable node symbol Symbol$_{var}$ from the natural number sums of the LLRs for each of the non-binary elements included in the extrinsic information Extrinsic$_{info}$.

The variable node LLR generating device 1004 may generate a variable node LLR vector LLR$_{var}$ formed of the LLRs for the remaining (q−1) non-binary elements excluding the variable node symbol Symbol$_{var}$ from the normalized extrinsic information Extrinsic$_{info}$. The variable node LLR generating device 1004 may provide the edge gain device 1006 with the generated variable node LLR vector LLR$_{var}$.

The edge gain device 1006 may generate an updated variable node message Message$_{var}$ by multiplying each of the detected variable node symbol Symbol$_{var}$ and the generated variable node LLR vector LLR$_{var}$ by an edge gain. The edge gain device 1006 may generate an edge gain symbol Symbol$_{edge}$ and an edge gain LLR vector LLR$_{edge}$ by multiplying each of the variable node symbol Symbol$_{var}$ and the variable node LLR vector LLR$_{var}$ by an edge gain. The process of generating the edge gain LLR vector LLR$_{edge}$ will be described later in detail with reference to FIG. 15.

The edge gain device 1006 may generate an updated variable node message Message$_{var}$ including the generated edge gain symbol Symbol$_{edge}$ and the edge gain LLR vector LLR$_{edge}$. The updated variable node message Message$_{var}$ may be represented by a vector of a (q*1) dimension. The component positioned in a first row of the updated variable node message Message$_{var}$ may be the edge gain symbol Symbol$_{edge}$, and the components positioned in second to q$^{th}$ rows may be the edge gain LLR vector LLR$_{edge}$. The edge gain device 1006 may provide the check node updating device 908 with the updated variable node message Message$_{var}$.

Referring back to FIG. 9, the check node updating device 908 may generate check node messages Message$_{check}$ based on the provided variable node message Message$_{var}$. Then, the check node updating device 908 may update the checks nodes 610 coupled to each of the selected variable nodes 620.

Figure 11:
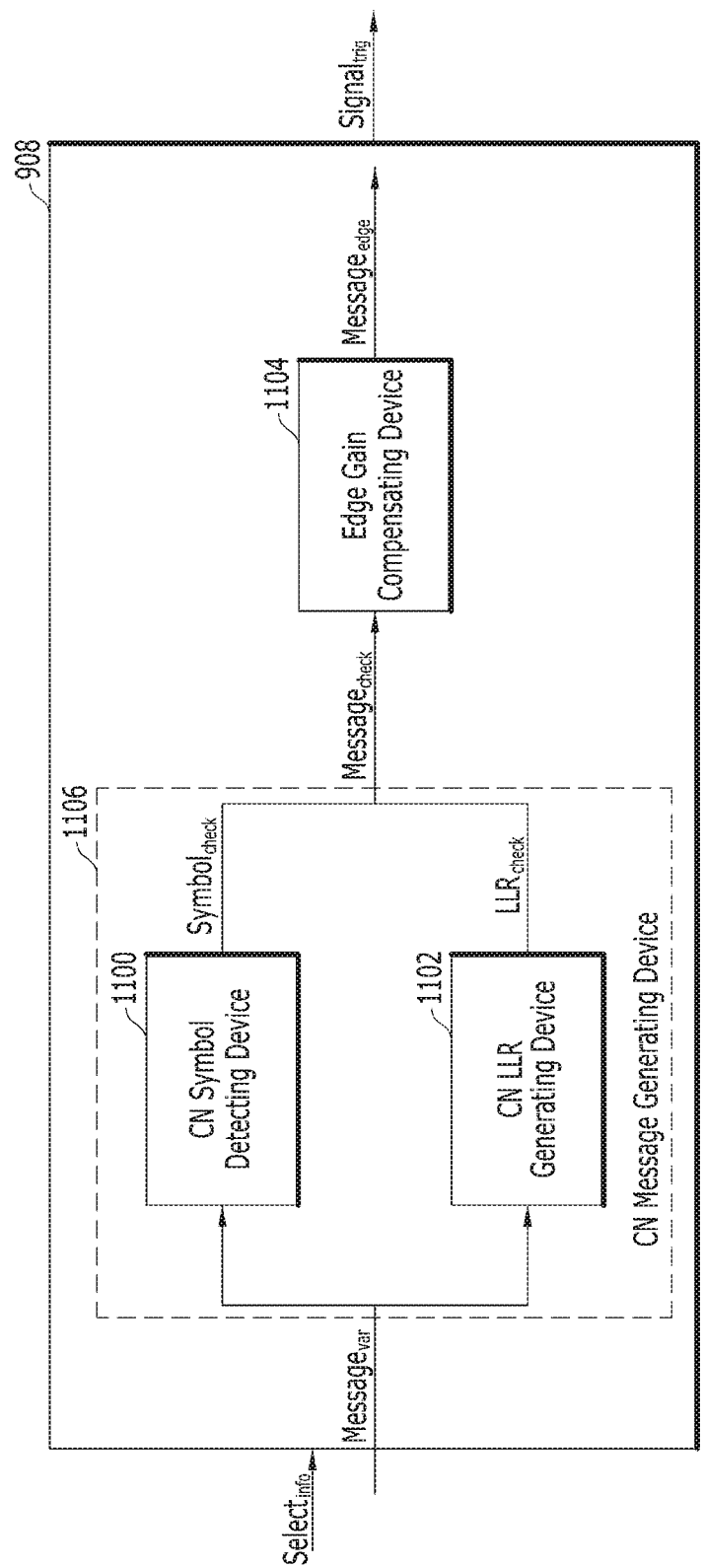
FIG. 11 is a block diagram illustrating a structure of a check node updating device.

FIG. 11 is a block diagram illustrating a structure of the check node (CN) updating device 908 of FIG. 9.

Referring to FIG. 11, the check node updating device 908 may include a check node message generating device 1106 and an edge gain compensating device 1104. The check node message generating device 1106 may include a check node (CN) symbol detecting device 1100 and a check node (CN) LLR generating device 1102.

As described above, the non-binary LDPC decoding may include a plurality of iteration units, each comprising a check node update operation, a variable node update operation, and a syndrome check operation after the initial update operation of the variable node 620. The variable node selecting device 902 may select one layer from N layers 804 of the parity check matrix 800 in FIG. 8 every time one iteration unit is performed. The non-binary LDPC decoding may include a plurality of cycles each of which includes performing one iteration N times so that the variable node selecting device 902 selects all of the N layers 804 of the parity check matrix 800 once.

The check node message generating device 1106 may include a check node symbol detecting device 1100 and a check node LLR generating device 1102. During one cycle, the check node symbol detecting device 1100 may detect a check node symbol Symbol$_{check}$ based on the variable node messages Message$_{var}$ provided from the selected variable nodes 620 among all the variable nodes respectively coupled to the check nodes 610 coupled to the selected variable nodes 620. During one cycle, the check node symbol detecting device 1100 may separately store a previous variable node symbol Symbol$_{pre.var}$ included in a previous variable node message Message$_{pre.var}$ provided from the selected variable nodes 620 among all the variable nodes coupled to the check nodes 610 which are coupled to the selected variable nodes 620 into a first storage space (not shown).

During the subsequent one cycle, the check node symbol detecting device 1100 may detect a value calculated by performing an XOR operation onto the variable node symbols Symbol$_{var}$ provided from all the variable nodes coupled to the check nodes 610 coupled to the selected variable nodes 620 as an XOR symbol Symbol$_{XOR}$. Then, the check node symbol detecting device 1100 may separately store the detected XOR symbol Symbol$_{XOR}$ into a second storage space (not shown). The check node symbol detecting device 1100 may detect a value calculated by performing an XOR operation onto a previous variable node symbol Symbol$_{pre}$ separately stored in the first storage space and the XOR symbol Symbol$_{XOR}$ separately stored in the second storage space as the check node symbol Symbol$_{check}$.

However, when the initial one cycle is performed, the previous variable node symbol Symbol$_{pre.var}$ may not exist. Therefore, when the variable node message Message$_{var}$ is initially provided to the check nodes, the check node symbol detecting device 1100 may initialize the previous variable node symbol Symbol$_{pre.var}$ for each of the check nodes as the variable node symbol Symbol$_{var}$ of the provided variable node message Message$_{var}$.

The check node symbol detecting device 1100 may initialize the previous variable node symbol Symbol$_{pre.var}$ for a check node. Then, when a subsequent variable node message Message$_{var}$ is provided to the check node, the check node symbol detecting device 1100 may detect a value calculated by performing an XOR operation onto the previous variable node symbol Symbol$_{pre.var}$ and the XOR symbol Symbol$_{XOR}$ as the check node symbol Symbol$_{check}$.

The check node LLR generating device 1102 may generate a check node LLR vector LLR$_{check}$ from the provided variable node message Message$_{var}$. Whenever the variable node message Message$_{var}$ is provided from each of the selected variable nodes 620 among all the variable nodes coupled to the check nodes 610, the check node LLR generating device 1102 may obtain a first minimum value vector and a second minimum value vector including the first minimum LLR min1 and the second minimum LLR mint among the components positioned on the same row of the variable node LLR vector $LLR_{var}$ included in the provided variable node message $Message_{var}$, as the components positioned in each row. Then, the check node LLR generating device 1102 may separately store the first minimum value vector and the second minimum value vector into a third storage space (not shown).

When the initial one cycle is performed, the first minimum value vector and the second minimum value vector may not exist. Therefore, in case of the variable node message $Message_{var}$ which is initially provided to each of the check nodes, the check node LLR generating device 1102 may initialize the first minimum value vector for each of the check nodes into the variable node LLR vector $LLR_{var}$ of the provided variable node message $Message_{var}$. The check node LLR generating device 1102 may initialize the first minimum value vector for a check node. Then, when a subsequent variable node message $Message_{var}$ is provided to the check node, the check node LLR generating device 1102 may compare the LLRs included in the variable node LLR vector $LLR_{var}$ of the subsequent variable node message $Message_{var}$ with the first minimum value vector for each row. Then, the check node LLR generating device 1102 may determine a smaller value among the compared LLRs as the first minimum LLR min1, and a larger value as the second minimum LLR min2. The check node LLR generating device 1102 may obtain the first minimum value vector and the second minimum value vector having the first minimum LLR min1 and the second minimum LLR min2 that are determined in the above as the components positioned in each row.

According to an embodiment of the present invention, the variable node selecting device 902 may select the variable nodes 620 respectively corresponding to the columns forming the sub-matrices 802 by selecting the sub-matrices 802 sharing the same layer 804 of the parity check matrix 800. As described above, since each of the sub-matrices 802 is a zero matrix or a cyclically shifted identity matrix, the number of the variable nodes coupled to the same check node 610 among the selected variable nodes may not be two or more. Accordingly, during one iteration unit, a variable node message $Message_{var}$ may be provided to each of the check nodes from one variable node at most. Further, the check node LLR generating device 1102 may not require a sorter of high complexity because only the LLRs included in the variable node LLR vector $LLR_{var}$ of the variable node message $Message_{var}$ provided to each of the check nodes. Furthermore, the LLRs included in the first minimum value vector and the second minimum value vector for each of the check nodes need to be compared with each other for each row.

The check node LLR generating device 1102 may generate the first minimum value location vector and the second minimum value location vector by recording the position of the variable node that provides the LLR including the components positioned in each row of the first minimum value vector and the second minimum value vector whenever the first minimum value vector and the second minimum value vector are updated. As the check node LLR generating device 1102 records the columns of the parity check matrix 800 which is described above with reference to FIG. 8, the check node LLR generating device 1102 may record the position of the variable node that provides the LLR including the components positioned in each row of the first minimum value vector and the second minimum value vector.

The check node LLR generating device 1102 may generate a check node LLR vector $LLR_{check}$ through a non-binary LDPC decoding algorithm such as the Min-sum algorithm or the Min-Max algorithm by using at least one between the first minimum value vector and the second minimum value vector. Accordingly, the check node message generating device 908 may generate a check node message $Message_{check}$ including the check node symbol $Symbol_{check}$ and the check node LLR vector $LLR_{check}$ that are generated above.

The check node symbol detecting device 1100 and the check node LLR generating device 1102 may perform a check node update operation after generating the check node message $Message_{check}$. The check node symbol detecting device 1100 may separately store a variable node symbol $Symbol_{var}$ of the provided variable node message $Message_{var}$ into the first storage space as a previous variable node symbol $Symbol_{pre.var}$. The check node LLR generating device 1102 may update the first minimum value vector and the second minimum value vector by comparing the sizes of the components positioned on the same row of the provided variable node message $Message_{var}$, the first minimum value vector, and the second minimum value vector for each row. Then, the check node LLR generating device 1102 may store the updated vectors into the third storage space.

The edge gain compensating device 1104 may multiply the check node symbol $Symbol_{check}$ of the generated check node message $Message_{check}$ and the check node LLR vector $LLR_{check}$ by an inverse number of the edge gain. The edge gain compensating device 1104 may multiply the check node symbol $Symbol_{check}$ and the check node LLR vector $LLR_{check}$ by the inverse number of the edge gain to generate a compensation edge gain symbol $Symbol_{edge}$ and the compensated edge gain LLR vector $LLR_{edge}$.

The edge gain compensating device 1104 may operate in opposition to the edge gain device 1006, which is described later with reference to FIG. 15, to generate the compensated edge gain symbol $Symbol_{edge}$ and the compensated edge gain LLR vector $LLR_{edge}$. The edge gain compensating device 1104 may multiply each of the non-binary elements corresponding to the LLRs positioned in each row of the check node LLR vector $LLR_{check}$ by the inverse number of the edge gain. The edge gain compensating device 1104 may determine the LLRs of the non-binary elements before multiplying the inverse number of the edge gain as the LLRs of the non-binary elements obtained through the multiplication operation.

After the check node updating device 908 performs the check node update operation, the check node updating device 908 may generate a trigger signal $Signal_{trig}$ and provide the variable node selecting device 902 with the trigger signal. The variable node selecting device 902 may select the layer 804 of the parity check matrix 800 according to the provided trigger signal and repeatedly perform the above-described operation until the non-binary LDPC decoding is successfully performed.

Figure 12A:
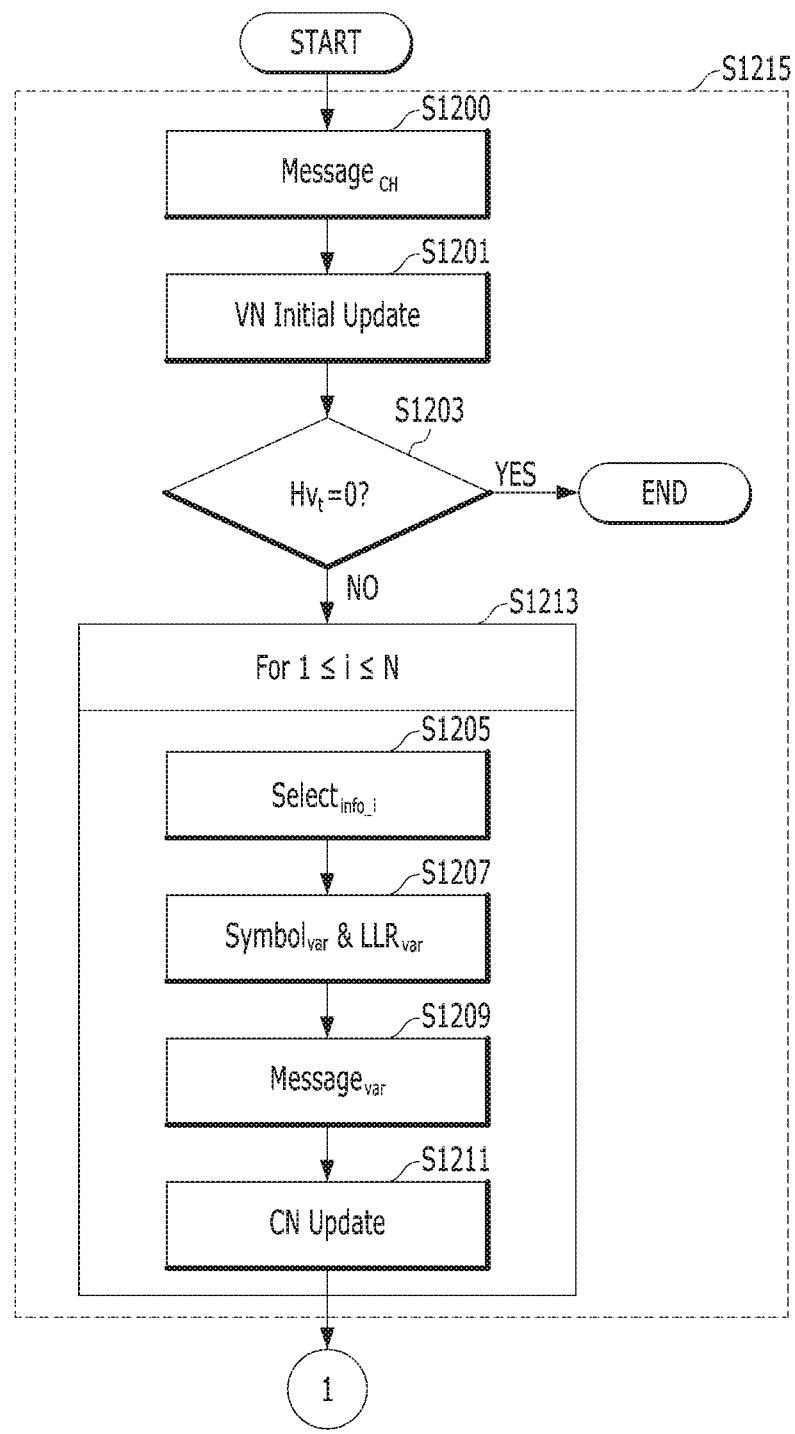
FIGS. 12A and 12B are flowcharts illustrating a non-binary LDPC decoding performed in a semiconductor system in accordance with an embodiment of the present invention.
Figure 12B:
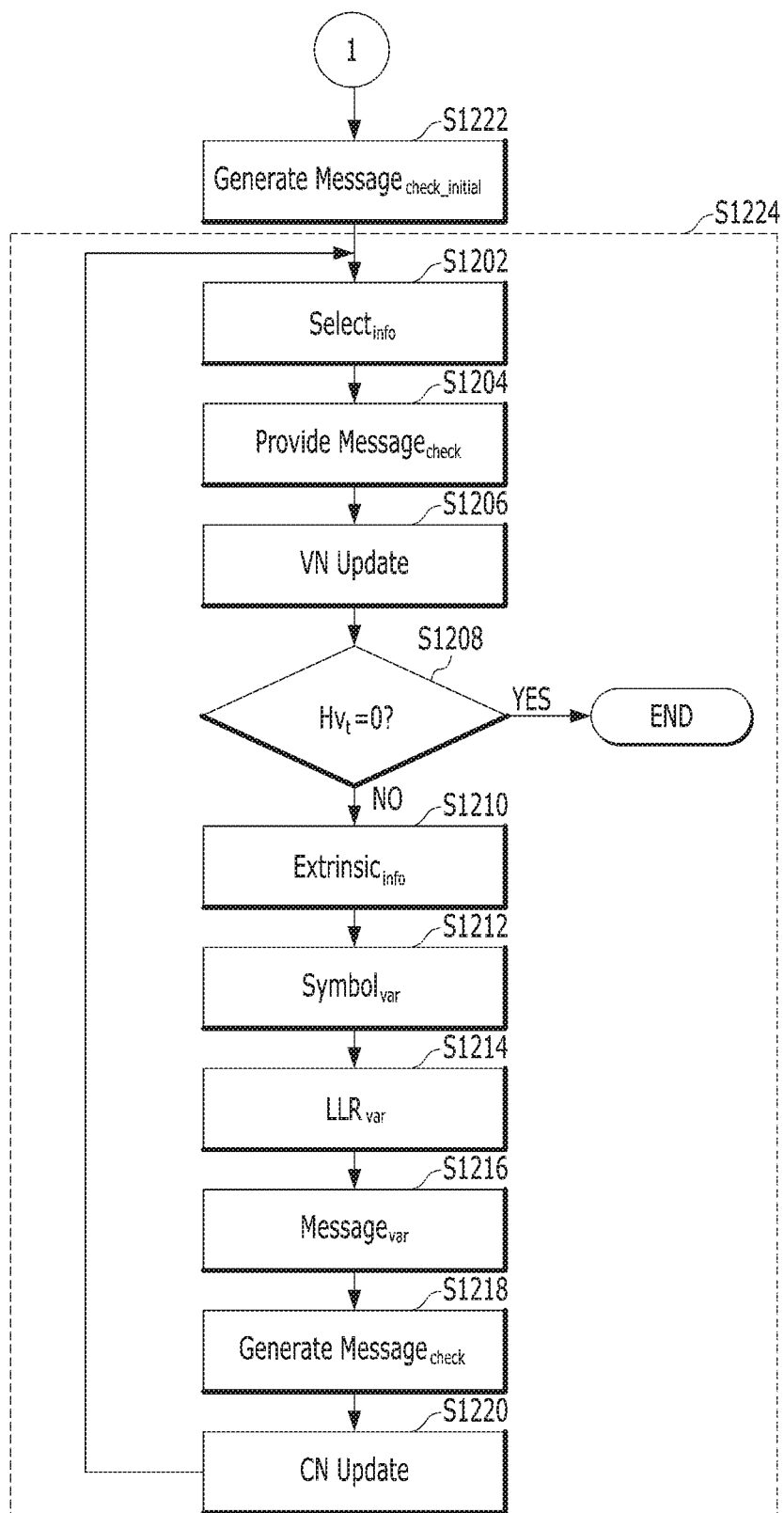

FIGS. 12A and 12B are flowcharts illustrating an operation of non-binary LDPC decoding performed by a semiconductor system 10 of FIG. 4A in accordance with an embodiment of the present invention.

Referring to FIG. 12A, at step S1200, the channel message generating device 900 may generate a channel message $Message_{CH}$ from the code word provided from the semiconductor memory device 200. The channel message Message$_{CH}$ may include a channel symbol Symbol$_{CH}$ and a channel LLR vector LLR$_{CH}$.

At step S1201, the variable node updating device 910 may perform an initial variable node update operation for initializing each symbol of the selected variable nodes 620 as the channel symbol Symbol$_{CH}$.

At step S1203, the syndrome checking device 912 may check whether the result of a product operation Hv$_t$ of a vector v including the symbol values of all the variable nodes 620 updated at the step S1201 as components and the parity check matrix 800 satisfies a specific condition. The syndrome checking device 912 may terminate the non-binary LDPC decoding if the specific condition is satisfied.

At step S1205, if the variable node selecting device 902 does not satisfy the specific condition at the step S1203, the variable node selecting device 902 may select the variable nodes 620 corresponding to the respective columns of the parity check matrix 800 and generate an i$^{th}$ variable node selection information Select$_{info\_i}$. The variable node selecting device 902 may select Z variable nodes 620 by selecting an i$^{th}$ layer 804 of the parity check matrix 800 described above with reference to FIG. 8.

At step S1207, the variable node message generating device 904 may detect a variable node symbol Symbol$_{var}$ and generate a variable node LLR vector LLR$_{var}$. The detected variable node symbol Symbol$_{var}$ may be the channel symbol Symbol$_{CH}$ generated at step S1200. The generated variable node LLR vector LLR$_{var1}$ may be the channel LLR vector LLR$_{CH}$ generated at step S1200.

At step S1209, the edge gain device 1006 may generate an edge gain symbol and an edge gain LLR vector by multiplying the variable node symbol Symbol$_{var}$ and the variable node LLR vector LLR$_{var}$ generated at step S1207 by an edge gain, respectively. The edge gain device 1006 may generate a variable node message Message$_{var}$ including an edge gain symbol and an edge gain LLR vector.

At step S1211, the check node updating device 908 may perform a check node update operation from the variable node message Message$_{var}$ generated at step S1209. The check node symbol detecting device 1100 may store an edge gain symbol of the variable node message Message$_{var}$ provided to each of the check nodes as a previous variable node symbol Symbol$_{pre.var}$ for each of the check nodes.

The check node symbol detecting device 1100 may detect a value calculated by performing an XOR operation on the variable node symbols and store the detected XOR symbol Symbol$_{XOR}$ into the second storage space. The variable node symbols may be provided from all the variable nodes 620 coupled to the check nodes, which is coupled to the selected variable nodes 620 as an XOR symbol.

The check node LLR generating device 1102 may generate the first minimum value vector and the second minimum value vector including the first minimum LLR min1 and the second minimum LLR mint among the components positioned in the same row of the variable node LLR vector LLR$_{var}$ included in the provided variable node message Message$_{var}$ as the components positioned in each row, whenever the variable node message Message$_{var}$ is provided from the selected variable nodes 620 to the check nodes 610 among all the variable nodes coupled to the check nodes 610, which is coupled to the selected variable nodes 620. Then, the check node LLR generating device 1102 may separately store the first minimum value vector and the second minimum value vector into the third storage space (not shown).

At step S1213, the check node updating device 908 may perform the check node update operation by repeatedly performing the above steps S1205 to S1211 until a variable (i) becomes N. At step S1215, the check node updating device 908 may not generate a check node message Message$_{check}$. The check node updating device 908 may perform a check node initialization operation to generate a check node message Message$_{check}$ provided to the variable nodes at step S1204 as described later.

After the check node initialization operation is performed at step S1215, the check node updating device 908 may generate a check node message Message$_{check}$ from the initialized check node and provide the selected variable nodes with the generated check node message Message$_{check}$, which will be described later at step S1224. The edge gain compensating device 1104 may multiply the check node symbol Symbol$_{check}$ of the generated check node message Message$_{check}$ and the check node LLR vector LLR$_{check}$ by the inverse number of the edge gain, respectively. The edge gain compensating device 1104 may multiply each of the non-binary elements corresponding to the LLR positioned in each row of the check node LLR vector LLR$_{check}$ by the inverse number of the edge gain. The edge gain compensating device 1104 may determine the LLR of each of the non-binary elements before multiplying the inverse number of the edge gain as the LLR of each of the non-binary elements obtained through the multiplication operation.

Referring to FIG. 12B, at step S1222, the check node updating device 908 may generate an initial check node message Message$_{check\_initial}$ after performing the check node initialization operation at the step S1215.

At step S1202, the variable node selecting device 902 may select the variable nodes 620 corresponding to the respective columns of the parity check matrix 800 whenever the operations of one iteration unit are performed to generate variable node selection information Select$_{info}$. The variable node selecting device 902 may select Z variable nodes 620 by selecting the layer 804 of the parity check matrix 800 described above with reference to FIG. 8.

At step S1204, the check node updating device 908 may provide the check node messages Message$_{check}$ generated at step S1222 and at step S1218, as described and below, to the variable nodes coupled to the check nodes 610.

At step S1206, the variable node updating device 910 may update the symbols of the selected variable nodes 620 at the step S1202 based on the channel message Message-H generated at the step S1200 and the check node messages Message$_{check}$ provided from the check nodes coupled to the selected variable nodes 620 at the steps S1222 and S1218.

Figure 13:
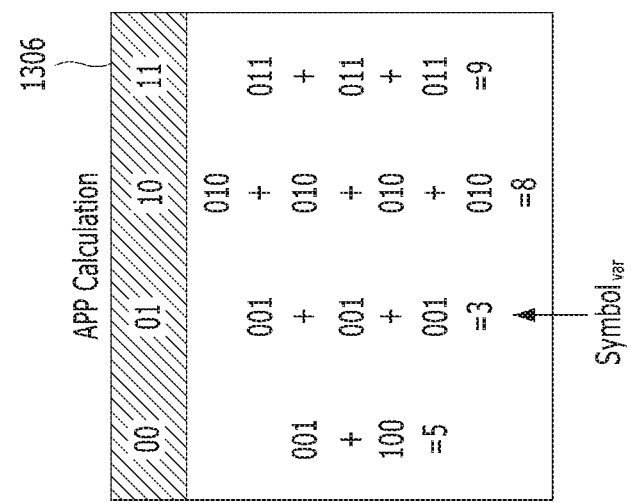
FIG. 13 illustrates an operation of updating symbols of variable nodes.
Figure 13:
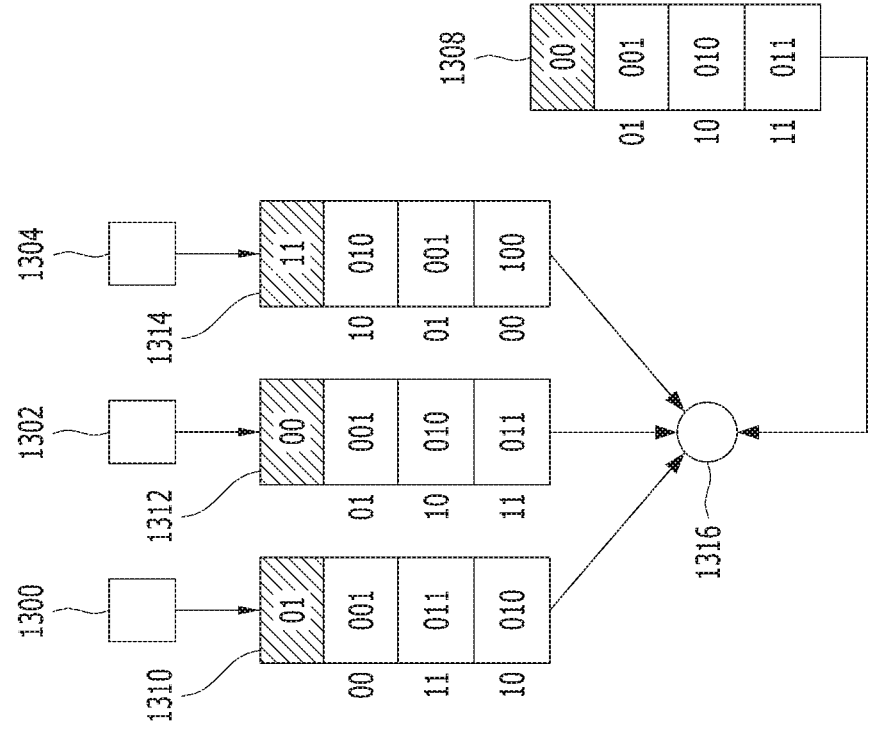

FIG. 13 illustrates an operation of updating the symbols of variable nodes 620.

Figure 14:
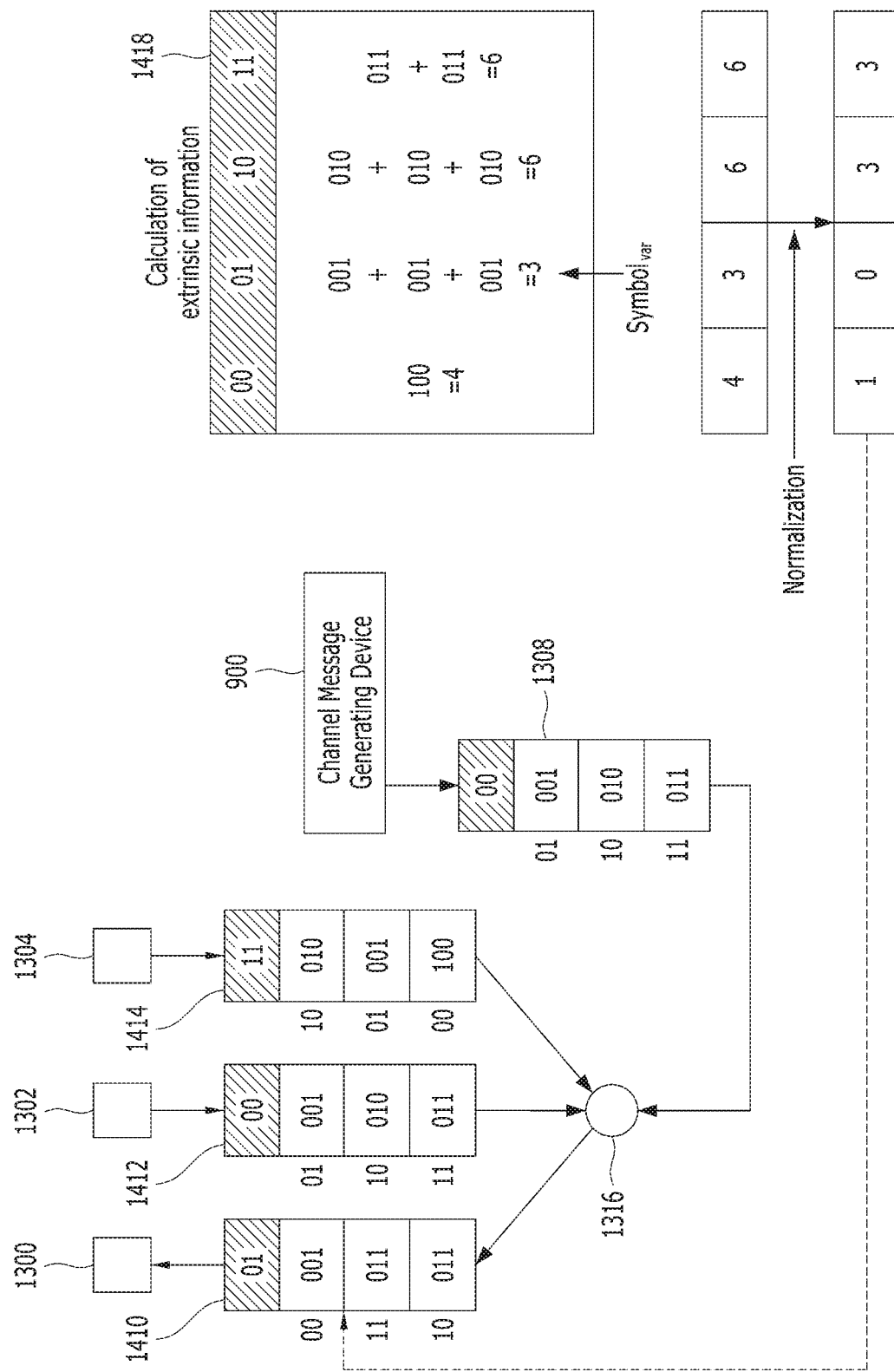
FIG. 14 illustrates an operation of generating a variable node symbol and a variable node LLR.
Figure 15:
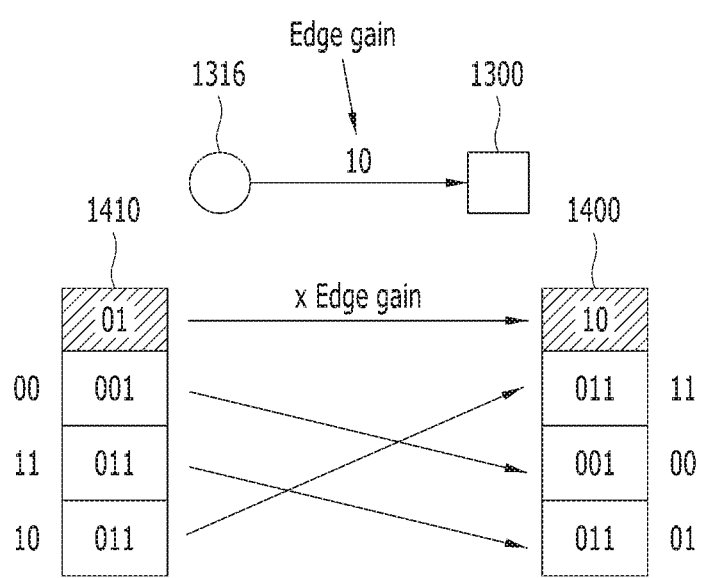
FIG. 15 is a diagram showing an operation of generating a variable node message.

By way of example, FIGS. 13 to 15 show a case where the q of the non-binary LDPC finite field (GF(q)) is 4 and the Z of a sub-matrix forming the parity check matrix 800 is 1.

As described above, the variable node updating device 910 may calculate APP (A Posteriori Probability) based on the check node LLR vectors LLR$_{check1}$, LLR$_{check2}$ and LLR$_{check3}$ of the first, second and third check node messages 1310, 1312 and 1314 provided from the coupling check nodes 1300, 1302 and 1304 and the channel message 1308 provided from the channel message generating device 900.

The channel symbol of the channel message 1308 may have a value of 00. The channel LLR vector LLR$_{CH}$ (001, 010,011) of the channel message 1308 may represent the LLR values of non-binary elements 01, 10 and 11, respectively.

A first check node symbol Symbol$_{check1}$ of the first check node message 1310 may have a value of 01. The first check node LLR vector LLR$_{check1}$ (001,011,010) of the first check node message 1310 may represent the LLR values of non-binary elements 00, 11 and 10, respectively.

A second check node symbol Symbol$_{check2}$ of the second check node message 1312 may have a value of 00. The second check node LLR vector LLR$_{check2}$ (001,010,011) of the second check node message 1312 may represent the LLR values of non-binary elements 01, 10 and 11, respectively.

A third check node symbol Symbol$_{check3}$ of the third check node message 1314 may have a value of 11. The third check node LLR vector LLR$_{check3}$ (010,001,100) of the third check node message 1314 may represent the LLR values of non-binary elements 10, 01 and 00, respectively.

The variable node updating device 910 may classify the LLR values included in the first to third check node messages 1310, 1312 and 1314 and the channel message 1308 that are provided to the selected variable node 1316 according to the non-binary elements on a non-binary LDPC finite field (GF(4)).

The variable node updating device 910 may generate an LLR value for each of the non-binary elements as the APP 1306 in addition to the LLR values classified by the non-binary elements. The variable node updating device 910 may generate the LLR value for each of the non-binary elements as the APP 1306 by converting the LLR values represented by the binary numbers into natural numbers and performing addition.

For example, the variable node updating device 910 may determine the LLR of a non-binary element having a value of 00 as '5' by converting '001' and '100' into natural numbers 1 and 4, respectively, and summing up the obtained natural numbers. Here, '001' is a component positioned in the second row of the first check node message 1310, and '100' is a component positioned in the fourth row of the third check node message 1314.

The variable node updating device 910 may determine the LLR of a non-binary element having a value of 01 as '3' by converting '001', '001', and '001' into natural numbers 1, 1 and 1, respectively, and summing up the obtained natural numbers. Here, the '001' values are components respectively positioned in the second row of the channel message 1308, in the second row of the second check node message 1312, and in the third row of the third check node message 1314.

The variable node updating device 910 may determine the LLR of a non-binary element having a value of 10 as '8' by converting '010', '010', '010', and '010' into natural numbers 2, 2, 2 and 2, respectively, and summing up the obtained natural numbers. Here, '010' values are components positioned in the third row of the channel message 1308, in the fourth row of the first check node message 1310, in the third row of the second check node message 1312, and in the second row of the third check node message 1314.

The variable node updating device 910 may determine the LLR of a non-binary element having a value of 11 as '9' by converting '011', '011', and '011' into natural numbers 3, 3 and 3, respectively, and summing up the obtained natural numbers. Here, the '011' values are components positioned in the fourth row of the channel message 1308, in the third row of the first check node message 1310, and in the fourth row of the second check node message 1312.

The variable node updating device 910 may update the non-binary element 01, as an updated symbol Symbol$_{var}$ of a variable node. The non-binary element 01 has the minimum value '3' among the natural number sums 5, 3, 8 and 9 of the LLRs for the non-binary elements as a natural number sum of the LLRs.

Referring back to FIG. 12B, at step S1208, the syndrome checking device 912 may determine whether the product Hv$_t$ operation result of the vector v including the symbols of the variable nodes 620 updated at the step S1206 and the parity check matrix 800 satisfies a specific condition or not. When the specific condition is satisfied (S1208, YES), the syndrome checking device 912 may terminate the non-binary LDPC decoding. When the specific condition is not satisfied (S1208, NO), the process may go to step S1210 to perform the non-binary LDPC decoding until the specific condition is satisfied.

At step S1210, the variable node message generating device 904 may generate extrinsic information Extrinsic$_{info}$ based on the channel message Message$_{CH}$ generated at the step S1200 and the check node message Message$_{check}$ provided from the check node updating device 908.

FIG. 14 illustrates an operation of generating a variable node symbol and a variable node LLR in accordance with an embodiment of the present invention.

Referring to FIG. 14, the extrinsic information generating device 1000 of FIG. 10 may select the first check node 1300 as a check node for providing the variable node message 1410 among the coupling check nodes 1300, 1302, and 1304.

The extrinsic information generating device 1000 may generate the extrinsic information 1418 by calculating a natural number sum of the second and third check node LLR vectors LLR$_{check2}$ and LLR$_{check3}$ of the second and third check node messages 1412 and 1414 and the channel LLR vector LLR$_{CH}$ of the channel message 1308. The second and third check node LLR vectors LLR$_{check2}$ and LLR$_{check3}$ of the second and third check node messages 1412 and 1414 may be provided from the remaining second and third check nodes 1302 and 1304 excluding the selected first check node 1300 among the coupling check nodes 1300, 1302 and 1304. The channel LLR vector LLR$_{CH}$ of the channel message 1308 may be provided from the channel message generating device 900.

The channel symbol Symbol$_{CH}$ of the channel message 1308 may have a value of 00. The components 001, 010, and 011 positioned in respective rows of the channel LLR vector LLR$_{CH}$ of the channel message 1308 are obtained by performing an XOR operation on '00', which is the value of the channel symbols Symbol$_{CH}$ and 01, 10, and 11, respectively.

A second check node symbol Symbol$_{check2}$ of the second check node message 1412 may have a value of 00. The components 001, 010, and 011 positioned in respective rows of the second check node LLR vector LLR$_{check2}$ of the second check node message 1412 may represent the LLR values of the non-binary elements 01, 10, and 11, which are obtained by performing an XOR operation of the second check node symbol Symbol$_{check2}$ having the value of 00 onto 01, 10, and 11, respectively.

A third check node symbol Symbol$_{check3}$ of the third check node message 1414 may have a value of 11. The components 010, 001, and 100 positioned in respective rows of the third check node LLR vector LLR$_{check3}$ of the third check node message 1414 may represent the LLR values of the non-binary elements 10, 01, and 00, which are obtained by performing an XOR operation of the third check node symbol Symbol$_{check3}$ having the value of 11 onto 01, 1.0, and 11, respectively.

The extrinsic information generating device 1000 may classify the LLR values positioned in the second to fourth rows of the second check node message 1412, the third check node message 1414, and the channel message 1308 provided to the selected variable node 1316 according to the non-binary elements. The extrinsic information generating device 1000 may generate the extrinsic information 1418 by summing LLR values classified by each non-binary element.

For example, the extrinsic information generating device 1000 may determine the LLR of a non-binary element having a value of 00 as '4', which is obtained by converting the component 100 positioned in the fourth row of the third check node message 1414 into a natural number. Also, the extrinsic information generating device 1000 may determine the LLR of a non-binary element having a value of 01 as '3', which is obtained by converting the component 001 positioned in the second row of the channel message 1308 into a natural number '1', converting the component 001 positioned in the second row of the second check node message 1412 into a natural number '1', and converting the component 001 positioned in the third row of the third check node message 1414 into a natural number '1', and summing up the natural numbers. The extrinsic information generating device 1000 may determine the LLR of the non-binary element having a value of 10 as '6', which is obtained by converting the component 010 positioned in the third row of the channel message 1308 into a natural number '2', converting the component 010 positioned in the third row of the second check node message 1412 into a natural number '2', and converting the component 010 positioned in the second row of the third check node message 1414 into a natural number '2', and summing up the natural numbers. The extrinsic information generating device 1000 may determine the LLR of a non-binary element having a value of 11 as '6', which is obtained by converting the component 011 positioned in the fourth row of the channel message 1308 into a natural number '3', and converting the component 011 positioned in the fourth row of the second check node message 1412 into a natural number '3', and summing up the natural numbers. When the LLR values of the determined non-binary elements 00, 01, 10, and 11 are represented by decimal numbers, they may be 4, 3, 6, and 6, respectively.

According to another embodiment of the present invention, the extrinsic information generating device 1000 may generate the extrinsic information 1418 based on the APP 1306 and the first check node message 1410, which are described above with reference to FIG. 13. The extrinsic information generating device 1000 may generate the extrinsic information 1418 by subtracting the LLR of each of the non-binary elements based on the first check node message 1410 from the LLR of each of the non-binary elements calculated based on the APP 1306. For example, according to the APP 1306 calculated in FIG. 13, the LLRs of the non-binary elements 00, 01, 10, and 11 may be 5, 3, 8, and 9, and the LLRs of the elements 00, 01, 10, and 11 may be 1, 0, 2, and 3, respectively. The extrinsic information generating device 1000 may generate the extrinsic information 1418 having 4, 3, 6, and 6 as the LLR values of 00, 01, 10, and 11 of the non-binary element by subtracting values of 1, 0, 2, and 3, from values of 5, 3, 8, and 9. The values of 1, 0, 2, and 3 are the LLR values of non-binary elements based on the first check node message 1410. The values of 5, 3, 8, and 9 are the LLR values of non-binary elements based on the APP 1306.

Referring back to FIG. 12B, at step S1212, the variable node symbol detecting device 1002 of FIG. 10 may detect a variable node symbol $Symbol_{var}$ from the extrinsic information $Extrinsic_{info}$ generated at the step S1210.

At step S1214, the variable node LLR generating device 1004 may generate a variable node LLR vector $LLR_{var}$ from the variable node symbol $Symbol_{var}$ detected at the step S1212.

At step S1216, the variable node message generating device 904 may generate the variable node message $Message_{var}$ from the variable node symbol $Symbol_{var}$ detected at the step S1212 and the variable node LLR vector $LLR_{var}$ generated at the step S1214.

Referring back to FIG. 14, the variable node symbol detecting device 1002 of FIG. 10 may detect a non-binary element 01 having the LLR value of 3, as the variable node symbol $Symbol_{var}$. The non-binary element 01 having the LLR value of 3 is the minimum value among the LLR values stored in the extrinsic information 1418.

The variable node LLR generating device 1004 may normalize the extrinsic information 1418 by subtracting 3 from the LLR value of each of the non-binary elements so that the LLR of the detected variable node symbol $Symbol_{var}$ may have a value of '0'. The variable node LLR generating device 1004 may determine the LLR values of the normalized non-binary elements 00, 01, 10, and 11 as 1, 0, 3, and 3, respectively. When the LLR values of the non-binary elements 00, 10, and 11 other than the detected variable node symbol $Symbol_{var}$ among the determined non-binary elements are represented by binary numbers, they may be 001, 011, and 011, respectively.

As described above, the edge gain device 1006 may generate a variable node message $Message_{var}$ by multiplying the detected variable node symbol $Symbol_{var}$ and the generated variable node LLR vector $LLR_{var}$ by an edge gain. The edge gain device 1006 may determine a variable node symbol $Symbol_{var}$ having a value of 01 as a component positioned in a first row of the variable node message 1410. Further, the edge gain device 1006 may determine 001, 011, and 011, which are the LLR values of non-binary elements 00, 11, and 10 as the components positioned in the second to fourth rows, respectively.

FIG. 15 is a diagram showing an operation of generating the variable node message $Message_{var}$.

Referring to FIG. 15, as shown in the example of FIG. 14 described above, the variable node message $Message_{var}$ may include values 01, 001, 011 and 011. The value of 01 is the component positioned in the first row of the generated variable node message 1410. The values of 001, 011, and 011 are positioned in the second to fourth rows respectively of the generated variable node message 1410. The value of 01 may be a variable node symbol $Symbol_{var}$. The values of 001, 011, and 011 may be the LLR values of the non-binary elements 00, 11, and 10, respectively, in a variable node LLR vector $LLR_{var}$.

The edge gain device 1006 may detect '10', which is a value obtained by multiplying the variable node symbol $Symbol_{var}$ having a value of 01 by the edge gain having a value of 10, as the edge gain symbol.

The edge gain device 1006 may determine the LLR values of non-binary elements 11, 00, and 01 that are calculated by performing an XOR operation onto the variable node symbol $Symbol_{var}$ having a value of 10 by 01, 10, and 11 as components to be positioned in the second to fourth rows of the variable node message 1410, respectively.

The edge gain device 1006 may multiply each of non-binary elements 00, 11, and 10 having the components positioned in the second to fourth rows of the updated variable node message 1400 as the LLR values by the edge gain having the value of 10. The edge gain device 1006 may determine 001, 011, and 011, which are the LLR values of the non-binary elements 00, 11, and 10 before multiplying the edge gain as the LLR values that the non-binary elements 00, 01, and 11 obtained through the multiplication are to have. The edge gain device 1006 may determine the components to be positioned in the second to fourth rows of the updated variable node message 1400 as 011, 001, and 011, which are the LLR values of the non-binary elements 11, 00, and 01.

Referring back to FIG. 12B, at step S1218, the check node symbol detecting device 1100 of FIG. 11 may generate a check node message Message$_{check}$ from the variable node messages Message$_{var}$ provided during one cycle.

As described above, the check node symbol detecting device 1100 may separately store the previous variable node symbol Symbol$_{pre.var}$ included in the previous variable node message Message$_{pre.var}$ provided from the same variable node 620 as the currently selected variable node 620 into a first storage space (not shown) before the cycle.

Also, as described above, the check node symbol detecting device 1100 may detect a value obtained by performing an XOR operation onto the variable node symbols Symbol$_{var}$ provided from all the variable nodes respectively coupled to the check nodes 610 coupled to the selected variable nodes 620 as an XOR symbol Symbol$_{XOR}$ while the subsequent one cycle is performed. Then, the check node symbol detecting device 1100 may separately store the detected XOR symbol Symbol$_{XOR}$ into a second storage space (not shown). The check node symbol detecting device 1100 may detect a value calculated by performing an XOR operation onto the previous variable node symbol Symbol$_{pre}$ separately stored in the first storage space and the XOR symbol Symbol$_{XOR}$ separately stored in the second storage space as a check node symbol Symbol$_{check}$.

For example, when the previous variable node symbols Symbol$_{pre.var}$ separately stored in the first storage space has a value of 11 and the XOR symbol Symbol$_{XOR}$ separately stored in the second storage space has a value of 10, the check node symbol Symbol$_{check}$ may have a value of 01 obtained by performing an XOR operation onto 11 and 10.

The check node LLR generating device 1102 may generate a check node LLR vector LLR$_{check}$ from the variable node message Message$_{var}$ generated at the step S1216. The check node LLR generating device 1102 may generate a check node LLR vector LLR$_{check}$ from the provided variable node message Message$_{var}$. The check node LLR generating device 1102 may obtain a first minimum value vector and a second minimum value vector including the first minimum LLR min1 and the second minimum LLR mint as the components positioned in the each row among the components positioned in the same row of the variable node LLR vector LLR$_{var}$ included in the provided variable node message Message$_{var}$, whenever the variable node message Message$_{var}$ is provided from each of the selected variable nodes 620 among all the variable nodes coupled to the check nodes 610 coupled to the selected variable nodes 620 to the check nodes 610. Then, the check node LLR generating device 1102 may separately store the first minimum value vector and the second minimum value vector into a third storage space (not shown).

The check node LLR generating device 1102 may generate a check node LLR vector LLR$_{check}$ based on a non-binary LDPC decoding algorithm by using at least one among the updated first minimum value vector and the second minimum value vector. Accordingly, the check node updating device 908 may generate a check node message Message$_{check}$ including the generated check node symbol symbol$_{check}$ and the check node LLR vector LLR$_{check}$.

At step S1220, the check node updating device 908 may perform a check node update operation. The check node updating device 908 may update the variable node symbol symbol$_{var}$ of the variable node message Message$_{var}$ generated at the step S1216 as a previous variable node symbol Symbol$_{pre.var}$ separately stored in the first storage space. The check node updating device 908 may compare the sizes of the components positioned in the same row among the components of the variable node LLR vector LLR$_{var}$ of the variable node message Message$_{var}$ provided at the step S1216, the first minimum value vector, and the second minimum value vector with each other on a row-by-row basis. Then, the check node updating device 908 may update the first minimum value vector and the second minimum value vector.

Figure 16:
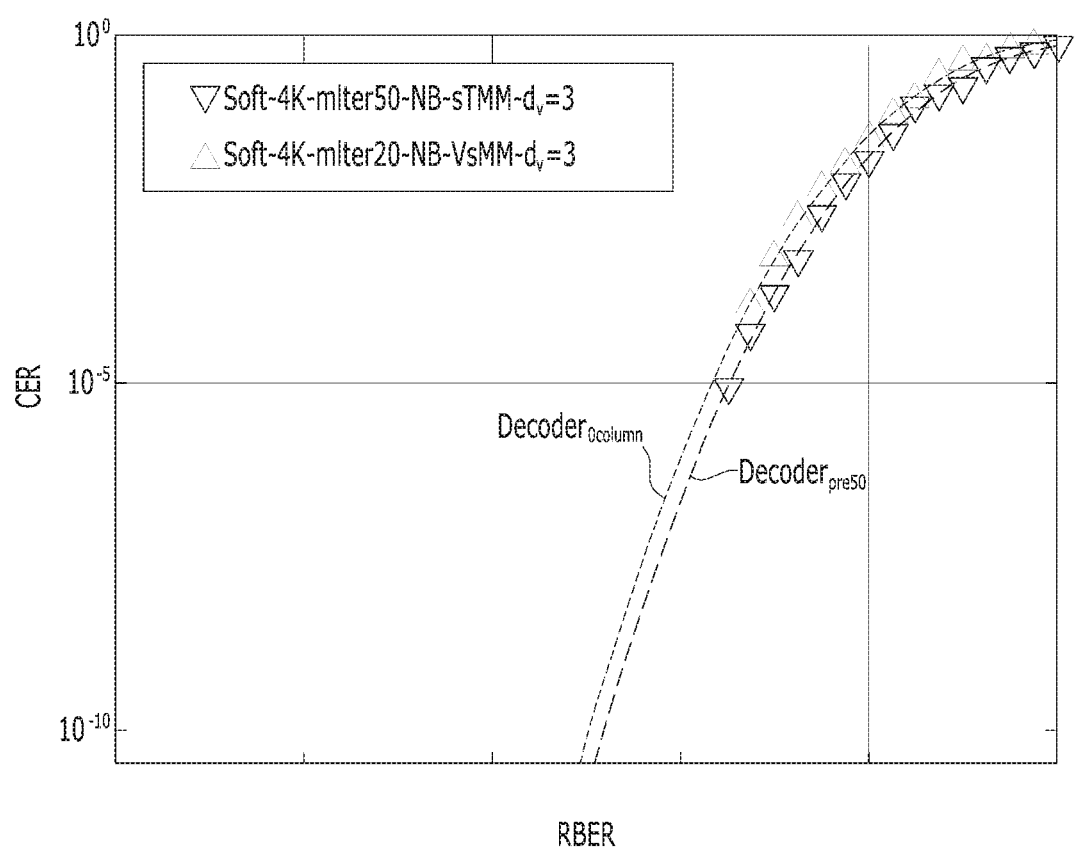
FIG. 16 is a graph showing an operation simulation result of a non-binary LDPC decoder in accordance with an embodiment of the present invention.

FIG. 16 is a graph showing an operation simulation result of the non-binary LDPC decoder 133 in accordance with an embodiment of the present invention.

The graph may show a Chunk Error Rate (CER) according to a Raw Bit Error Rate (RBER) of a non-binary LDPC decoder Decoder$_{pre50}$ according to the prior art and a non-binary LDPC decoder Decoder$_{column20}$ in accordance with an embodiment of the present invention. The maximum number of iteration units for the non-binary LDPC decoder Decoder$_{pre50}$ is 50, and the maximum number of iteration units for the non-binary LDPC decoder Decoder$_{colum20}$ is 20. The non-binary LDPC decoder according to an embodiment of the present invention may have a CER value based on the same RBER which is similar to the non-binary LDPC decoder Decoder$_{pre50}$. Therefore, the non-binary LDPC decoder in accordance with an embodiment of the present invention may have a faster convergence speed than the non-binary LDPC decoder according to the prior art under the condition that the maximum number of iteration units is the same.

According to embodiments of the present invention, systems, devices and methods are provided to quickly and accurately decode a data stored in a memory cell of a semiconductor memory device.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A semiconductor memory system, comprising: a semiconductor memory device suitable for storing a code word, which is encoded data; a decoder suitable for decoding the stored code word based on a parity check matrix formed of sub-matrices to generate decoded data; and a channel suitable for coupling the semiconductor memory device to the decoder and providing the decoder with the stored code word, wherein the decoder includes: a variable node selecting device suitable for performing a variable node selection operation of sequentially selecting sub-matrices sharing the same layer of the parity check matrix and sequentially selecting variable nodes respectively corresponding to columns forming the selected sub-matrices; a variable node updating device suitable for performing a variable node update operation of updating the selected variable nodes based on a channel message and check node messages provided to the selected variable nodes; and a check node updating device suitable for performing a check node update operation of updating check nodes based on variable node messages provided to the check nodes coupled to the selected variable nodes.

2. The semiconductor memory system of claim 1, wherein the decoder determines the variable node selection operation, the variable node update operation, and the check node update operation as one iteration unit, and repeatedly performs the iteration unit until the code word is successfully decoded up to a maximum number of times.

3. The semiconductor memory system of claim 1, wherein the decoder further includes:
   a channel message generating device suitable for generating the channel message including a channel symbol and a channel LLR vector based on the code word provided from the channel;
   a syndrome checking device suitable for terminating the decoding and outputting the decoded data by obtaining a zero vector by multiplying symbols of variable nodes corresponding to all columns forming the parity check matrix by the parity check matrix; and
   a variable node message generating device suitable for generating a variable node message including an edge symbol and an edge LLR vector.

4. The semiconductor memory system of claim 3, wherein the variable node message generating device includes:
   an extrinsic information generating device suitable for generating extrinsic information based on the channel message and the check node messages;
   a variable node symbol detecting device suitable for detecting a variable node symbol based on the extrinsic information;
   a variable node log likelihood ratio (LLR) generating device suitable for generating a variable node LLR vector based on the detected variable node symbol and the generated extrinsic information; and
   an edge gain device suitable for generating the edge symbol and the edge LLR vector by multiplying the detected variable node symbol and the generated variable node LLR vector by an edge gain.

5. The semiconductor memory system of claim 4, wherein the extrinsic information generating device generates the extrinsic information by calculating sums of LLRs included in the channel LLR vector and LLRs included in check node LLR vectors of the remaining check node messages, excluding check node messages provided from check nodes which are to provide the variable node message from each of the selected variable nodes, among the check node messages provided to the selected variable nodes for each non-binary element.

6. The semiconductor memory system of claim 4, wherein the variable node symbol detecting device re-sets a non-binary element corresponding to a minimum value of the sums of the LLRs calculated for each non-binary element based on the extrinsic information with variable node symbols of the variable node messages provided from the selected variable nodes to the check nodes coupled to the selected variable nodes.

7. The semiconductor memory system of claim 4, wherein the variable node LLR generating device generates the variable node LLR vector by performing an extrinsic information normalization operation to obtain a difference between each of the sums of the LLRs calculated for each of the non-binary elements included in the extrinsic information and a sum of the LLRs for the non-binary element corresponding to the minimum value of the sums of the calculated LLRs.

8. The semiconductor memory system of claim 4, wherein the edge gain device obtains first non-binary elements corresponding to LLRs positioned in the respective rows of the variable node LLR vector and second non-binary elements by multiplying the first non-binary elements by the edge gain, and
   generates the edge LLR vector by determining the LLRs respectively corresponding to the first non-binary elements as LLRs of the second non-binary elements having the same value as the first non-binary elements, respectively.

9. The semiconductor memory system of claim 1, wherein the variable node updating device initializes a symbol of each of the selected variable nodes into a channel symbol.

10. The semiconductor memory system of claim 1, wherein when the variable node messages are initially provided from the selected variable nodes to the check nodes respectively coupled to the selected variable nodes, the check node updating device initializes previous variable node symbols and first minimum value vectors for the check nodes are into variable node symbols and variable node LLR vectors of the variable node messages.

11. The semiconductor memory system of claim 1, wherein the variable node updating device calculates sums of log-likelihood ratios (LLRs) included in check node LLR vectors of the check node messages provided to the selected variable nodes and LLRs included in a channel LLR vector of the channel message for each non-binary element, and updates a non-binary element corresponding to a minimum value with the symbol of each of the selected variable nodes.

12. The semiconductor memory system of claim 1, wherein the check node updating device includes: a check node message generating device suitable for generating a check node message including a check node symbol and a check node log-likelihood ratio (LLR) vector based on a variable node message, a first minimum value vector, and a second minimum value vector; and an edge gain compensating device suitable for generating a compensation edge gain symbol and a compensation edge gain LLR vector by multiplying the generated check node message by an inverse number of an edge gain, wherein the check node updating device sets variable node symbols of the variable node messages provided to the check nodes coupled to the selected variable nodes as previous variable node symbols after generating the check node message, and updates the first minimum value vector and the second minimum value vector by comparing sizes of components positioned in the same row of the first minimum value vector, the second minimum value vector, and a variable node LLR vector with each other.

13. The semiconductor memory system of claim 12, wherein the check node message generating device includes:
   a check node symbol detecting device suitable for generating a check node symbol by performing an XOR operation on an XOR symbol which is obtained by performing an XOR operation on the previous variable node symbol and variable node symbols provided from all variable nodes provided to the check nodes coupled to the selected variable nodes; and
   a check node LLR suitable for generating the check node LLR vector based on one between the first minimum value vector and the second minimum value vector.

14. A decoding device comprising: a variable node selecting device suitable for sequentially selecting variable nodes respectively corresponding to columns forming sub-matrices, which share the same layer of a parity check matrix including a plurality of sub-matrices; a variable node updating device suitable for updating the selected variable nodes based on a channel message and check node messages provided to the selected variable nodes; and a check node updating device suitable for updating check nodes based on variable node messages provided to the check nodes coupled to the selected variable nodes, wherein the sequentially selecting of the variable nodes, the updating of the selected variable nodes, and the updating of the check nodes are performed as an iteration unit until a code word is successfully decoded up to a maximum number of times.

15. The decoding device of claim 14, wherein the decoding device further includes: a channel message generating device suitable for generating the channel message including a channel symbol and a channel LLR vector based on the code word provided from the channel; a syndrome checking device suitable for terminating the decoding and outputting decoded data by obtaining a zero vector by multiplying symbols of variable nodes corresponding to all columns forming the parity check matrix by the parity check matrix; and a variable node message generating device suitable for generating a variable node message including an edge symbol and an edge LLR vector.

16. The decoding device of claim 15, wherein the variable node message generating device includes:
- an extrinsic information generating device suitable for generating extrinsic information based on the channel message and the check node messages;
- a variable node symbol detecting device suitable for detecting a variable node symbol based on the extrinsic information;
- a variable node log likelihood ratio (LLR) generating device suitable for generating a variable node LLR vector based on the detected variable node symbol and the generated extrinsic information; and
- an edge gain device suitable for generating the edge symbol and the edge LLR vector by multiplying the detected variable node symbol and the generated variable node LLR vector by an edge gain.

17. The decoding device of claim 14, wherein the variable node updating device initializes a symbol of each of the selected variable nodes into a channel symbol.

18. The decoding device of claim 14, wherein when the variable node messages are initially provided from the selected variable nodes to the check nodes respectively coupled to the selected variable nodes, the check node updating device initializes previous variable node symbols and first minimum value vectors for the check nodes are into variable node symbols and variable node LLR vectors of the variable node messages.

19. The decoding device of claim 14, wherein the variable node updating device calculates sums of log-likelihood ratios (LLRs) included in check node LLR vectors of the check node messages provided to the selected variable nodes and LLRs included in a channel LLR vector of the channel message for each non-binary element, and updates a non-binary element corresponding to a minimum value with the symbol of each of the selected variable nodes.

20. The decoding device of claim 14, wherein the check node updating device includes: a check node message generating device suitable for generating a check node message including a check node symbol and a check node log-likelihood ratio (LLR) vector based on a variable node message, a first minimum value vector, and a second minimum value vector; and an edge gain compensating device suitable for generating a compensation edge gain symbol and a compensation edge gain LLR vector by multiplying the generated check node message by an inverse number of an edge gain, wherein the check node updating device sets variable node symbols of the variable node messages provided to the check nodes coupled to the selected variable nodes as previous variable node symbols after generating the check node message, and updates the first minimum value vector and the second minimum value vector by comparing sizes of components positioned in the same row of the first minimum value vector, the second minimum value vector, and a variable node LLR vector with each other.

* * * * *